(12) United States Patent
Kal et al.

(10) Patent No.: US 8,354,680 B2
(45) Date of Patent: Jan. 15, 2013

(54) AC LIGHT EMITTING DIODE HAVING FULL-WAVE LIGHT EMITTING CELL AND HALF-WAVE LIGHT EMITTING CELL

(75) Inventors: Dae Sung Kal, Ansan-si (KR); Won Cheol Seo, Ansan-si (KR); Jang Woo Lee, Ansan-si (KR); Jin Cheol Shin, Ansan-si (KR); Jong Kyu Kim, Ansan-si (KR); Sang Ki Jin, Ansan-si (KR); So Ra Lee, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 133 days.

(21) Appl. No.: 12/882,406

(22) Filed: Sep. 15, 2010

(65) Prior Publication Data
US 2011/0062459 A1    Mar. 17, 2011

(30) Foreign Application Priority Data

Sep. 15, 2009   (KR) .................. 10-2009-0086877
Sep. 25, 2009   (KR) .................. 10-2009-0090994

(51) Int. Cl.
*H01L 33/00*    (2010.01)

(52) U.S. Cl. .......... 257/88; 313/499; 313/500; 315/291; 257/E33.066

(58) Field of Classification Search ...................... 257/88
See application file for complete search history.

(56) References Cited

U.S. PATENT DOCUMENTS

| | | | |
|---|---|---|---|
| 7,808,189 B2* | 10/2010 | Hollnberger et al. | 315/291 |
| 8,188,489 B2* | 5/2012 | Lee et al. | 257/88 |
| 2005/0253151 A1 | 11/2005 | Sakai et al. | |
| 2008/0017871 A1 | 1/2008 | Lee et al. | |
| 2008/0246040 A1* | 10/2008 | Sakai et al. | 257/76 |
| 2010/0102337 A1* | 4/2010 | Lee et al. | 257/88 |

\* cited by examiner

*Primary Examiner* — Jerome Jackson, Jr.
(74) *Attorney, Agent, or Firm* — H.C. Park & Associates, PLC

(57) ABSTRACT

The present invention discloses an alternating current (AC) light emitting diode (LED) having half-wave light emitting cells and full-wave light emitting cells. The AC LED has a plurality of light emitting cells electrically connected between bonding pads on a single substrate. The AC LED includes a first row of half-wave light emitting cells each having an anode terminal and a cathode terminal, a second row of full-wave light emitting cells each having an anode terminal and a cathode terminal, and a third row of half-wave light emitting cells each having an anode terminal and a cathode terminal. In the AC LED, the second row is arranged between the first row and the third row, and the third row includes a pair of light emitting cells that share a cathode terminal with each other. The cathode terminal shared by the pair of light emitting cells in the third row is electrically connected to the anode terminal of a corresponding light emitting cell of the half-wave light emitting cells in the first row through a conductor that is electrically insulated from the full-wave light emitting cells in the second row.

23 Claims, 13 Drawing Sheets

AC LIGHT EMITTING DIODE HAVING FULL-WAVE LIGHT EMITTING CELL AND HALF-WAVE LIGHT EMITTING CELL

CROSS-REFERENCE TO RELATED APPLICATIONS

This application claims priority from and the benefit of Korean Patent Application No. 2009-0086877, filed on Sep. 15, 2009, and Korean Patent Application No. 2009-0090994, filed on Sep. 25, 2009, which are hereby incorporated by reference for all purposes as if fully set forth herein.

BACKGROUND OF THE INVENTION

1. Field of the Invention

The present invention relates to a compound semiconductor light emitting diode (LED), and more particularly, to an alternating current (AC) LED having full-wave light emitting cells and half-wave light emitting cells.

2. Discussion of the Background

Compound semiconductor light emitting diodes (LEDS), e.g., GaN-based LEDS, are widely used for display elements and backlights. Further, these LEDs have less electric power consumption and a longer lifespan as compared with conventional light bulbs or fluorescent lamps, so that their application area has been expanded for general illumination to substitute for conventional incandescent bulbs and fluorescent lamps.

An LED is repeatedly turned on/off depending on a direction of current under AC power. Therefore, when the LED is directly connected to an AC power source, there is a problem in that the LED may not continuously emit light and may be easily damaged due to reverse current.

To solve such a problem, an LED (chip) that can be directly connected to a high-voltage AC power source is disclosed by SAKAI et al. in U.S. Patent Application Publication No. 2005/0253151, filed on Aug. 28, 2003, entitled "LIGHT-EMITTING DEVICE HAVING LIGHT-EMITTING ELEMENTS". Further, AC LEDs having various structures are being developed.

According to U.S. Patent Application Publication No. 2005/0253151, LEDs are two-dimensionally connected through bonding wires in series on a single insulating substrate, such as a sapphire substrate, to form LED arrays. Such two LED arrays are connected to each other in reverse parallel on the substrate, so that light is continuously emitted in response to power supplied from an AC power supply.

According to U.S. Patent Application Publication No. 2005/0253151, one of the LED arrays operates during one half cycle of AC power, and the other array operates during the other half cycle of the AC power. That is, half of the light emitting cells in an LED operate until is a phase of the AC power is changed. Therefore, the use efficiency of the light emitting cells does not exceed 50%.

Meanwhile, an LED is disclosed in U.S. Patent Application Publication No. 2008/0017871, in which a bridge rectifier is formed on a substrate using light emitting cells and an array of serially connected light emitting cells is disposed between two nodes of the bridge rectifier so that the LED operates under AC power. Accordingly, the array of light emitting cells connected to the bridge rectifier emits full-wave light regardless of changes in phase of AC power, so that the use efficiency of light emitting cells can be increased.

However, as the number of light emitting cells connected to the bridge rectifier is increased, high reverse voltage is applied to a specific light emitting cell in the bridge rectifier, and therefore, the light emitting cell in the bridge rectifier is damaged. As a result, the LED may be damaged. To prevent such a problem, the number of light emitting cells in the array of light emitting cells connected to the bridge rectifier may be decreased. However, in this case, it is difficult to provide an LED operating under high-voltage AC power. On the other hand, the reverse voltage can be decreased by increasing the number of light emitting cells connected to the bridge rectifier. However, the use efficiency of light emitting cells is accordingly lowered.

SUMMARY OF THE INVENTION

Exemplary embodiments of the present invention provide an AC light emitting diode (LED) capable of minimizing reverse voltage applied to light emitting cells and increasing the effective light emitting area of the light emitting cells.

Exemplary embodiments of the present invention also provide an AC LED capable of improving the array structure of light emitting cells to minimize reverse voltage is applied to a single light emitting cell.

Exemplary embodiments of the present invention also provide an AC LED capable of allowing uniform forward voltage to be applied to light emitting cells.

Additional features of the invention will be set forth in the description which follows, and in part will be apparent from the description, or may be learned by practice of the invention.

A first exemplary embodiment of the present invention discloses an AC LED having a plurality of light emitting cells electrically connected between bonding pads on a single substrate. The AC LED includes a first row of half-wave light emitting cells each having an anode terminal and a cathode terminal, a second row of full-wave light emitting cells each having an anode terminal and a cathode terminal, and a third row of half-wave light emitting cells each having an anode terminal and a cathode terminal. Here, the second row is arranged between the first row and the third row, and the third row includes a pair of light emitting cells that share a cathode terminal with each other. Further, the cathode terminal shared by the pair of light emitting cells in the third row is electrically connected to the anode terminal of a corresponding half-wave light emitting cell of the half-wave light emitting cells in the first row through a conductor that is electrically insulated from the full-wave light emitting cells in the second row.

A second exemplary embodiment of the present invention discloses an AC LED having full-wave light emitting cells and half-wave light emitting cells. Each full-wave light emitting cell includes a lower semiconductor layer, an upper semiconductor layer, an active layer arranged between the lower semiconductor layer and the upper semiconductor layer; a first electrode pad arranged on the lower semiconductor layer and electrically connected to the lower is semiconductor layer, a second electrode pad arranged on the upper semiconductor layer and electrically connected to the upper semiconductor layer, and a connection pad arranged on the lower semiconductor layer or the upper semiconductor layer, the connection pad being electrically insulated from the lower semiconductor layer and the upper semiconductor layer.

A third exemplary embodiment of the present invention discloses an AC LED having a plurality of light emitting cells electrically connected on a single substrate. The AC LED includes a first pair of half-wave light emitting cells, a first full-wave light emitting cell, and a second pair of half-wave light emitting cells. The full-wave light emitting cell is arranged between the first pair of half-wave light emitting cells and the second pair of half-wave light emitting cells, the first full-wave light emitting cell being electrically connected to the first pair of half-wave light emitting cells and the second pair of half-wave light emitting cells, and the first pair of half-wave light emitting cells share an anode terminal or a cathode terminal with each other.

A fourth exemplary embodiment of the present invention discloses an AC LED having a plurality of light emitting cells electrically connected on a single substrate. The AC LED includes a first bonding pad and a second bonding pad; and a plurality of basic units electrically connected between the bonding pads. Each basic unit includes a first pair of half-wave light emitting cells, a full-wave light emitting cell, and a second pair of half-wave light emitting cells. The full-wave light emitting cell is arranged between the first pair of half-wave light emitting cells and the second pair of half-wave light emitting cells, the full-wave light emitting cell being electrically connected to the first pair of half-wave light emitting cells and the second pair of half-wave light emitting cells, and the first pair of half-wave light emitting cells share an anode terminal or a cathode terminal with each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
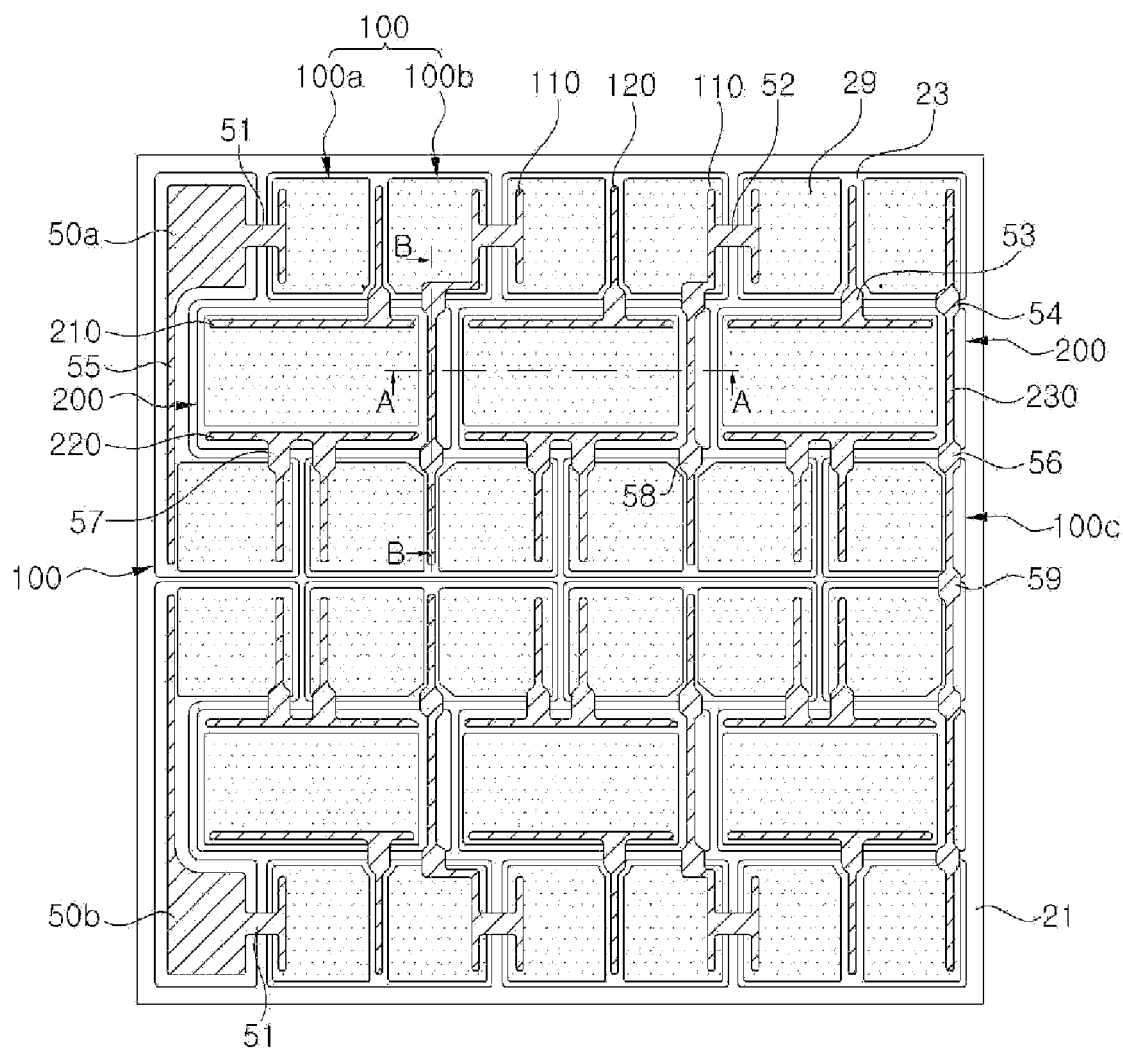
FIG. 1 is a plan view illustrating an AC light emitting diode (LED) according to a first exemplary embodiment of the present invention.

The invention is described more fully hereinafter with reference to the is accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
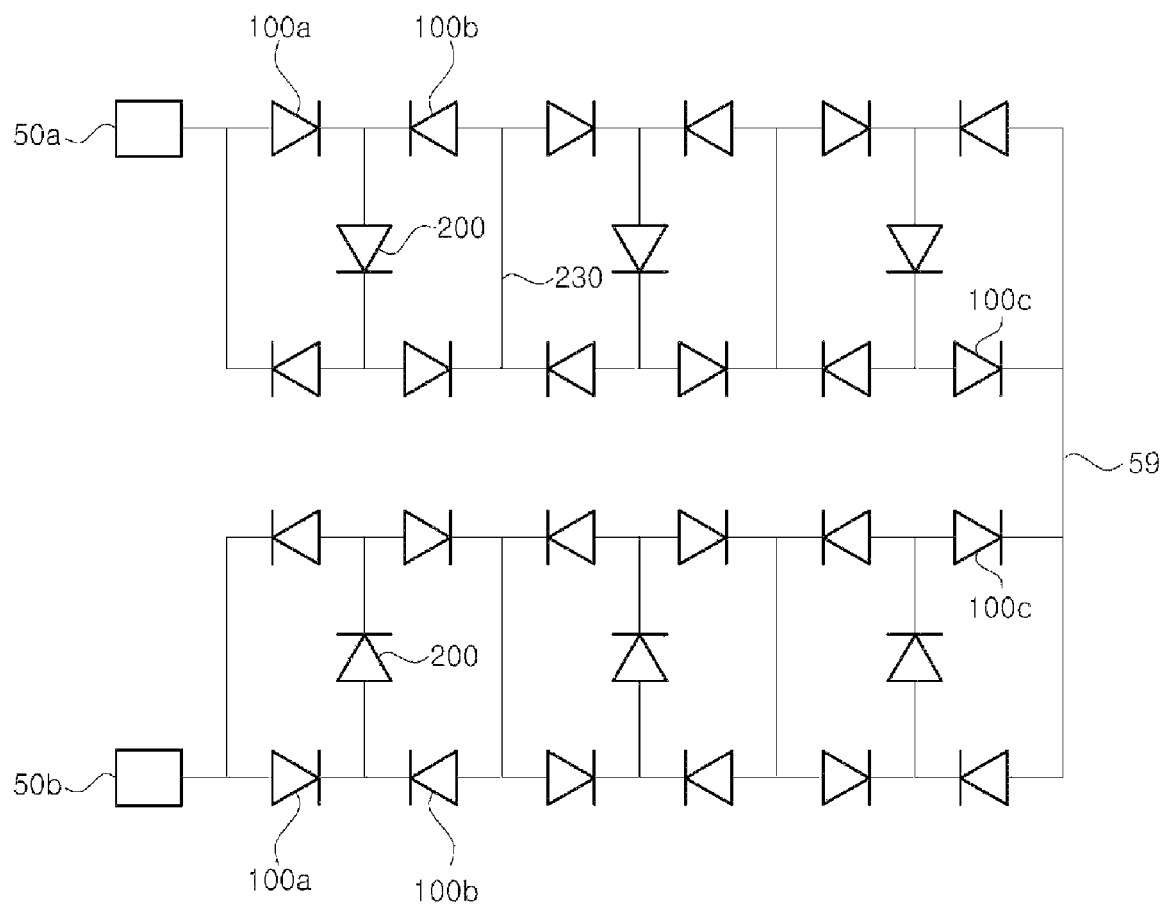
FIG. 2 is an equivalent circuit diagram of FIG. 1.
Figure 3:
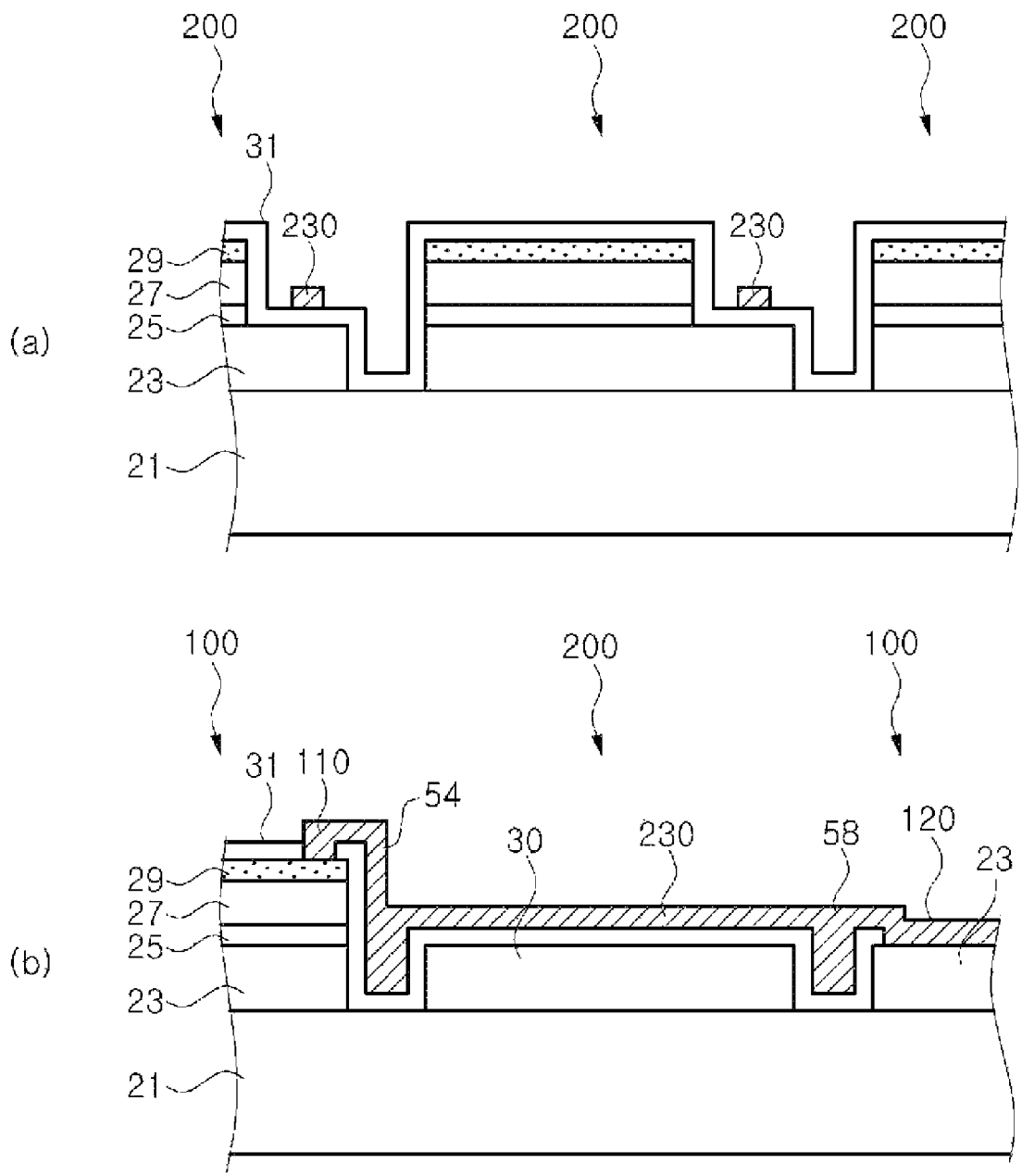
FIG. 3 (*a*) and FIG. 3 (*b*) are schematic sectional views taken along lines A-A and B-B in FIG. 1, respectively.

FIG. 1 is a schematic plan view illustrating an AC light emitting diode (LED) according to a first exemplary embodiment of the present invention. FIG. 2 is an equivalent circuit diagram of FIG. 1. FIG. 3 (*a*) and FIG. 3 (*b*) are schematic sectional views taken along lines A-A and B-B in FIG. 1, respectively.

Referring to FIG. 1, the LED comprises a substrate 21, bonding pads 50*a* and 50*b*, and half-wave light emitting cells 100*a*, 100*b* and 100*c* and full-wave light emitting cells 200, which are arranged on the substrate 21. The light emitting cells 100*a*, 100*b*, 100*c* and 200 are electrically connected to one another by wires 51 to 59 between the bonding pads 50*a* and 50*b* to constitute an equivalent circuit as shown in FIG. 2.

Each of the light emitting cells comprises an anode terminal and a cathode terminal. Here, the terms "anode terminal" and "cathode terminal" are terminals placed at both ends of a light emitting cell, through which current flows into and out of the light emitting cell, respectively, and may be any one connected to a wire. For example, the cathode terminal may be an n-type semiconductor layer 23 of a light emitting cell or an electrode pad formed on the n-type semiconductor layer 23, and the anode terminal may be a p-type semiconductor layer 27 (FIG. 3), a transparent electrode layer 29 formed on the p-type semiconductor layer 27, or an electrode pad formed on the p-type semiconductor layer 27 or the transparent electrode layer 29. For convenience of illustration, it will be described below assuming that the anode and cathode terminals of each of the half-wave light emitting cells 100*a*, 100*b* and 100*c* are a p-electrode pad 110 and an n-electrode pad 120, respectively, and the anode and cathode terminals of each of the full-wave light emitting cells 200 are a p-electrode pad 210 and an n-electrode pad 220, respectively. However, the present invention is not limited thereto. It will be understood that the electrode pads 110, 120, 210 and 220 are not separately formed, but the wires may be formed directly at the positions of the electrode pads.

The half-wave light emitting cells 100*a* and 100*b* form a pair and share a cathode terminal 120. This means that the half-wave light emitting cells 100*a* and 100*b* share an n-type semiconductor layer 23. The light emitting cells 100*a* and 100*b* are disposed to face each other and have anode terminals 110 opposite to each other, in addition to the shared cathode terminal 120 disposed in the middle therebetween. Pairs 100 of the half-wave light emitting cells 100a and 100b may be arranged on the substrate 21. Meanwhile, each of the half-wave light emitting cells 100c independently has anode and cathode terminals 110 and 120.

In the present exemplary embodiment, a first row of the LED may comprise pairs 100 of half-wave light emitting cells 100a and 110b, and the first bonding pad 50a may be arranged together with the pairs of half-wave light emitting cells 100a and 100b in the first row. The first bonding pad 50a is electrically connected to an anode terminal 110 of a half-wave light is emitting cell 100a through a wire 51. The arranged pairs 100 of half-wave light emitting cells 100a and 100b are connected to each other through wires 52, and the wires 52 electrically connect the anode terminals 110 of adjacent half-wave light emitting cells 100a and 100b to each other.

Meanwhile, a second row comprises full-wave light emitting cells 200, and the number of the full-wave light emitting cells 200 is the same as that of the pairs 100 of half-wave light emitting cells 100a and 100b in the first row. For example, the number of the pairs 100 of half-wave light emitting cells 100a and 100b in the first row and the number of the full-wave light emitting cells 200 are all three as shown in FIG. 1.

Each of the full-wave light emitting cells 200 independently has an anode terminal 210 and a cathode terminal 220, and the anode terminals 210 are electrically connected to the shared cathode terminals 120 in the first row through wires 53, respectively. In addition, each of the full-wave light emitting cells 200 has a connection pad 230. The connection pad 230 is electrically insulated from the full-wave light emitting cell 200 and is positioned on the full-wave light emitting cell 200. One end of the connection pad 230 is electrically connected to the anode terminal 110 of the half-wave light emitting cell 100b through a wire 54.

Meanwhile, a third row of the AC LED comprises half-wave light emitting cells 100a, 100b and 100c. The half-wave light emitting cells 100a and 100b form a pair (100) by sharing a cathode terminal 120, like those in the first row, and each of the half-light emitting cells 100c independently has a cathode terminal 120.

In the third row, the half-wave light emitting cells 100c are disposed at both sides of the pairs 100 of half-wave light emitting cells 100a and 100b, respectively. The cathode terminal 120 of the half-wave light emitting cell 100c positioned at one end of the third row is is electrically connected to the first bonding pad 50a through a wire 55, and the cathode terminal 120 of the half-wave light emitting cell 100c positioned at the other side is connected to the connection pad 230 of the full-wave light emitting cell 200. Meanwhile, each of the anode terminals 110 of the half-wave light emitting cells 100a, 100b and 100c is electrically connected to the cathode terminal 220 of a corresponding full-wave light emitting cell 200 through a wire 57. That is, the cathode terminal 220 of the full-wave light emitting cell 200 is electrically connected to the anode terminals 110 of two half-wave light emitting cells positioned below the full-wave light emitting cell 200 among the half-wave light emitting cells 100a, 100b and 100c.

Meanwhile, the cathode terminals 120 shared by the half-wave light emitting cells 100a and 100b in the third row are electrically connected to the connection pads 230 of the full-wave light emitting cells 200 through wires, respectively. Thus, the shared cathode terminals 210 in the third row are electrically connected to the anode terminals 110 of the light emitting cells 100b in the first row through connection pads 230 and wires 54 and 58, respectively.

In the present exemplary embodiment, a fourth row of half-wave light emitting cells, a fifth row of full-wave light emitting cells, a sixth row of half-wave light emitting cells and a second bonding pad 50b are arranged in a mirror symmetrical shape with respect to the first bonding pad 50a, the first row of the half-wave light emitting cells, the second row of the full-wave light emitting cells and the third row of the half-wave light emitting cells. The second bonding pad 50b is disposed in parallel with the sixth row of the half-wave light emitting cells. Meanwhile, the cathode terminal 120 of the half-wave light emitting cell 100c disposed at the other end of the third row is electrically connected to the cathode terminal 120 of a corresponding half-wave light emitting cell in the fourth row through a wire 59.

Although it has been described in the present exemplary embodiment that the is cathode terminal 120 shared by the half-wave light emitting cells 100a and 100b in the third row is electrically connected to the light emitting cell in the first row through the connection pad 230 and the wires 54 and 58, the connection pad may be a portion of the wires as described above. That is, the cathode terminal 120 shared by the half-wave light emitting cells 100a and 100b in the third row may be connected to the half-wave light emitting cell in the first row through a single wire. Although the wire may cross over the top of the full-wave light emitting cell, it is not limited thereto, but the wire may cross a region between the full-wave light emitting cells.

Although the connection pad 230 and/or the wires 54 and 58 may be formed of the same material as other wires, they are not limited thereto. Particularly, the connection pad 230 and/or the wires 54 and 58 may be formed to have a higher resistance compared with the other wires by adjusting their width and thickness. Alternatively, the connection pad 230 and/or the wires 54 and 58 may be formed of a material with a higher resistivity compared with the other wires, e.g., indium tin oxide (ITO) or poly-silicon, so as to have a relatively higher resistance compared with the other wires.

Accordingly, there is provided the LED having an equivalent circuit diagram as shown in FIG. 2.

Referring to FIG. 2, if AC voltage is applied to the LED by connecting an AC power source to the first and second bonding pads 50a and 50b, current sequentially flows to the second bonding pad 50b via the half-wave light emitting cell 100a connected to the first bonding pad 50a in the first row and the full-wave light emitting cells 200 during a half cycle, thereby driving the LED, and current sequentially flows to the first bonding pad 50a via the half-wave light emitting cell 100a connected to the second bonding pad 50b in the sixth row and the full-wave light emitting cells 200 during the next half cycle, thereby driving the LED. At this time, is the half-wave light emitting cells 100a, 100b and 100c are driven during a half cycle, and the full-wave light emitting cells 200 are driven during a full cycle.

Here, there are half-wave light emitting cells to which reverse voltage is applied during a half cycle. At this time, the half-wave light emitting cells in the first row and the half-wave light emitting cells in the third row are directly connected through the connection pads 230, and hence, the reverse voltage applied to one half-wave light emitting cell is almost the same as the sum of the forward voltages respectively applied to one half-wave light emitting cell 100a or 100b and one full-wave light emitting cell 200. Thus, the reverse voltage applied to the half-wave light emitting cells 100a and 100b can be minimized.

Meanwhile, the connection pads 230 may be formed of resistors, and thus, the number of light emitting cells to which forward voltage is applied during a half-cycle under high voltage can be decreased without separately providing external resistors.

FIG. 3 (a) and FIG. 3 (b) are schematic sectional views taken along lines A-A and B-B in FIG. 1, respectively.

Referring to FIG. 3 (a) and FIG. 3 (b), each of the half-wave light emitting cells 100a, 100b and 100c and the full-wave light emitting cells 200 comprises a lower semiconductor layer 23, an active layer 25 and an upper semiconductor layer 27. The active layer 25 may be formed to have a single quantum well structure or a multiple quantum well structure, and the material and composition of the active layer 25 may be selected depending on the required wavelength of light. For example, the active layer may be formed of AlInGaN-based compound semiconductor such as InGaN. Meanwhile, the lower and upper semiconductor layers 23 and 27 may be formed of AlInGaN based compound semiconductor, such as GaN, which has a band gap larger than that of the active layer 25. Meanwhile, a buffer layer (not shown) may be interposed is between the lower semiconductor layer 23 and the substrate 21.

The upper semiconductor layer 27 is formed on a portion of the lower semiconductor layer 23, and the active layer 25 is interposed between the lower and upper semiconductor layers 25 and 27. The lower semiconductor layer 23 may be an n-type semiconductor layer, and the upper semiconductor layer 27 may be a p-type semiconductor layer. A transparent electrode layer 29 may be positioned on the upper semiconductor layer 27. The transparent electrode layer 29 may be formed of a material such as ITO or Ni/Au. Alternatively, the lower semiconductor layer 23 may be a p-type semiconductor layer, and the upper semiconductor layer 27 may be an n-type semiconductor layer. In this case, the transparent electrode layer 29 may be omitted.

Meanwhile, a connection pad 230 is positioned on the lower semiconductor layer 23 of the full-wave light emitting cell 200. The connection pad 230 is electrically insulated from the lower semiconductor layer 23 by an insulating layer 31. As shown in FIG. 3 (b), the connection pad 230 is electrically connected to an anode terminal 110 of one half-wave light emitting cell of a pair 100 of half-wave light emitting cells in the first row through a wire 54, and electrically connected to a shared cathode terminal 120 of a pair 100 of half-wave light emitting cells in the third row through a wire 58.

In the present exemplary embodiment, since the connection pad 230 is positioned on the lower semiconductor layer 23, it is unnecessary to etch and remove a portion of the lower semiconductor layer 23 at which the connection pad 230 is positioned, thereby simplifying manufacturing processes. Portions of the lower semiconductor layers 23 at which the connection pads 230 are positioned may be exposed when the lower semiconductor layers of the light emitting cells 100a, 100b, 100c and 200 are exposed to form n-electrode pads 120 and 220.

Although it has been described in this embodiment that the p-electrode pads 110 and 210 are anode terminals and n-electrode pads 120 and 220 are cathode terminals 120, which are distinguished from the wires 51 to 59, the p-electrode pads and the n-electrode pads may be formed when the wires are formed. That is, the p-electrode pads and the n-electrode pads may be a portion of the wires. In this case, the anode and cathode terminals become portions of the light emitting cell where wires are electrically connected, e.g., a transparent electrode layer 29 (or upper semiconductor layer 27) and a lower semiconductor layer 23.

Although it has been described that the connection pads 230 are components distinguished from the wires, the connection pads 230 may be formed when the wires are formed, and therefore, the connection pads may be a portion of the wires. Thus, the shared cathode terminals in the third row are directly connected to the anode terminals of corresponding light emitting cells in the first row by the wires that are insulated from and crossing over the full-wave light emitting cells 200.

Although it has been described in this embodiment that the connection pads 230 are positioned on the lower semiconductor layer 23 to be insulated from the lower semiconductor layer 23 by the insulating layer 31, the connection pads 230 may be positioned on the upper semiconductor layer 27. This will be described with reference to FIG. 4 (a) and FIG. 4 (b).

Figure 4:
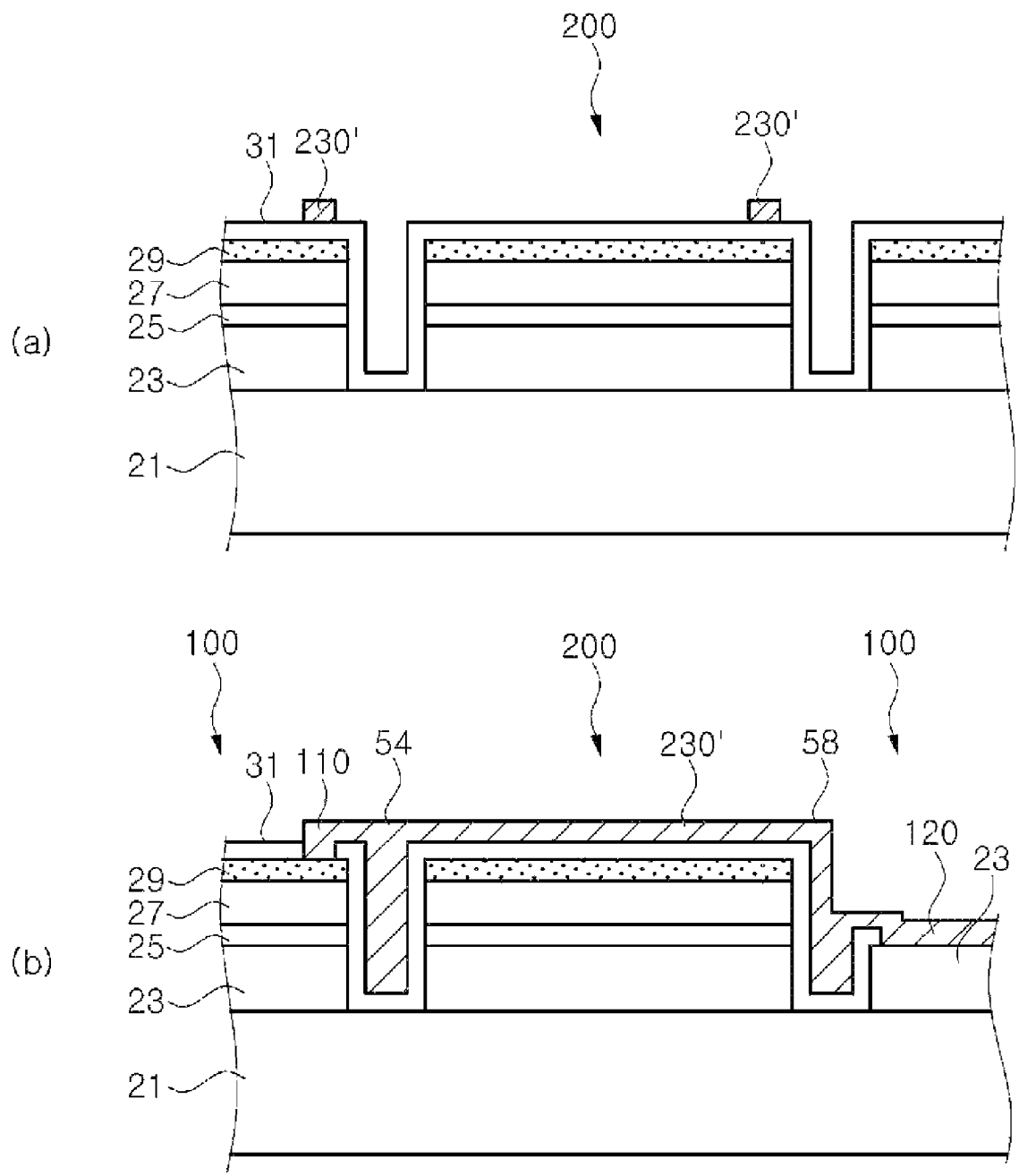
FIG. 4 (*a*) and FIG. 4 (*b*) are sectional views illustrating an AC LED according to a second exemplary embodiment of the present invention.

FIG. 4 (a) and FIG. 4 (b) are sectional views illustrating an AC LED according to a second exemplary embodiment of the present invention. Here, FIG. 4 (a) and FIG. 4 (b) correspond to FIG. 3 (a) and FIG. 3 (b), respectively.

Referring to FIG. 4 (a) and FIG. 4 (b), connection pads 230' are positioned on an upper semiconductor layer 27. In a case where a transparent electrode layer 29 is positioned on the upper semiconductor layer, the connection pads 230' are positioned on the transparent is electrode layer 29. The connection pads 230' are insulated from the transparent electrode layer 29 or the upper semiconductor layer 27 by an insulating layer 31.

As described with reference to FIG. 3 (b), the connection pad 230' is connected to anode and cathode terminals 110 and 120 through wires 54 and 58. As described above, the connection pad 230', the p-electrode pads 110 and 210 and the n-electrode pads 120 and 220 may be a portion of the wires.

In the present exemplary embodiment, since the connection pad 230' is positioned on the upper semiconductor layer 27, it is unnecessary to remove a portion of the upper semiconductor layer 27 and a portion of an active layer 25 in a full-wave light emitting cell 200 for the purpose of forming the connection pad 230'. Thus, the light emitting area of the full-wave light emitting cell 200 can be increased.

Although it has been described in the aforementioned exemplary embodiments that the first low of the LED comprises pairs of light emitting cells that share a cathode terminal, the first row may comprise half-wave light emitting cells 100c each independently having a cathode terminal.

In the arrangement of the light emitting cells described in FIG. 1, the positions of the first and third rows may be changed with each other, and further more rows may be arranged on the substrate 21. Meanwhile, although it has been described that the LED of FIG. 1 has a minor symmetrical structure, it is not limited thereto. That is, the light emitting cells may be variably arranged so that the LED can be driven by AC power.

The following exemplary embodiments disclose various AC LEDs configured using a basic unit of light emitting cells having a specific structure. In the following exemplary embodiments, the basic unit comprises half-wave light emitting cells and a full-wave light is emitting cell and has a form similar to a bridge rectifier. Further, a plurality of basic units is electrically connected to one another in various forms, thereby configuring AC LEDs.

Figure 5:
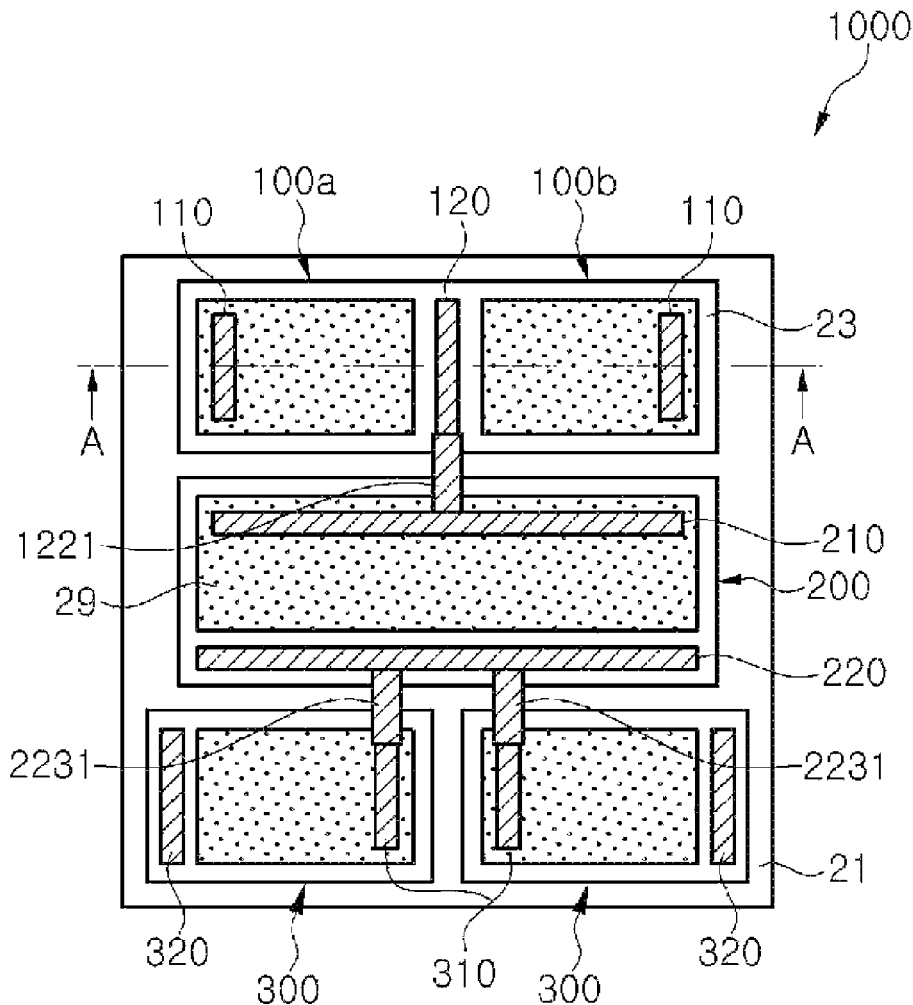
FIG. 5 is a plan view illustrating a basic unit of light emitting cells available for AC LEDs according to exemplary embodiments of the present invention.
Figure 6:
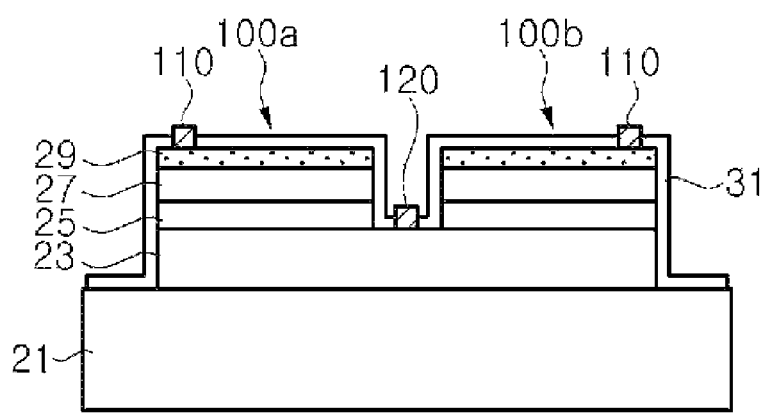
FIG. 6 is a sectional view taken along line A-A in FIG. 5.

FIG. 5 is a plan view illustrating a basic unit 1000 of light emitting cells available for AC LEDs according to an exemplary embodiment of the present invention. FIG. 6 is a sectional view taken along line A-A in FIG. 5.

Referring to FIGS. 5 and 6, the basic unit 1000 is disposed on a substrate 21 and comprises a pair of half-wave light emitting cells 100a and 100b, a full-wave light emitting cell 200 and a pair of half-wave light emitting cells 300. The light emitting cells 100a, 100b, 200 and 300 are electrically connected by wires 1221 and 2231.

Each of the light emitting cells comprises an anode terminal and a cathode terminal. Here, the terms "anode terminal" and "cathode terminal" mean terminals placed at both ends of a light emitting cell, through which current flows into and out of the light emitting cell, respectively. The anode and cathode terminals are positioned on the light emitting cell. For example, the cathode terminal may be an electrode pad 120 or 320 formed on an n-type semiconductor layer 23 of the light emitting cell, and the anode terminal may be an electrode pad 110 or 310 formed on a p-type semiconductor layer 27 (or, the transparent electrode if a transparent electrode layer 29 is formed on the p-type semiconductor layer). For convenience of illustration, it will be described below assuming that the anode and cathode terminals of each of the half-wave light emitting cells 100a and 100b are a p-electrode pad 110 and an n-electrode pad 120, respectively, the anode and cathode terminals of the full-wave light emitting cell 200 are a p-electrode pad 210 and an n-electrode pad 220, respectively, and the anode and cathode terminals of each of the half-wave light emitting cells 300 are a p-electrode pad 310 and an n-electrode pad 320, respectively. Although it will be described below assuming that the electrode is pads and the wires are distinguished from each other, the electrode pads 110, 120, 210, 220, 310 and 320 may be not separately formed, but the wires may be directly formed at the positions of the electrode pads.

The half-wave light emitting cells 100a and 100b form a pair 100 and share a cathode terminal 120. This means that the half-wave light emitting cells 100a and 100b share the n-type semiconductor layer 23. The light emitting cells 100a and 100b are disposed to face each other and have anode terminals 110 opposite to each other, in addition to the shared cathode terminal 120 disposed in the middle therebetween. Meanwhile, each of the half-wave light emitting cells 300 independently has an anode terminal 110 and a cathode terminal 120. The half-wave light emitting cells 300 are arranged in pairs to be faced and separated from each other.

The full-wave light emitting cell 200 is positioned between the half-wave light emitting cells 100a and 100b and the half-wave light emitting cells 300. The full-wave light emitting cell 200 has an anode terminal 210 and a cathode terminal 220. The anode terminal 210 is electrically connected to the cathode terminal shared by the half-wave light emitting cells 100a and 100b through a wire 1221, and the cathode terminal 220 is electrically connected to the anode terminals 310 of the half-wave light emitting cells 300 through wires 2231.

The half-wave light emitting cells 100a and 100b are disposed in one row (first row), the full-wave light emitting cell 200 is disposed in another row (second row), and the half-wave light emitting cells 300 are disposed in further another row (third row).

Referring to FIG. 6, each of the half-wave light emitting cells 100a and 100b comprises a lower semiconductor layer 23, an active layer 25 and an upper semiconductor layer 27. The active layer 25 may be formed to have a single quantum well structure or a multiple is quantum well structure, and the material and composition of the active layer 25 may be selected depending on the required wavelength of light. For example, the active layer may be formed of AlInGaN-based compound semiconductor such as InGaN. Meanwhile, the lower and upper semiconductor layers 23 and 27 may be formed of AlInGaN based compound semiconductor, such as GaN, which has a band gap larger than that of the active layer 25. Meanwhile, a buffer layer (not shown) may be interposed between the lower semiconductor layer 23 and the substrate 21.

The upper semiconductor layer 27 is formed on a portion of the lower semiconductor layer 23, and the active layer 25 is interposed between the lower and upper semiconductor layers 25 and 27. The lower semiconductor layer 23 may be an n-type semiconductor layer, and the upper semiconductor layer 27 may be a p-type semiconductor layer. At this time, a transparent electrode layer 29 may be positioned on the upper semiconductor layer 27. The transparent electrode layer 29 may be formed of a material such as ITO or Ni/Au. Anode terminals 110 are positioned on the half-wave light emitting cells 100a and 100b, respectively, and a cathode terminal is positioned in the middle between the half-wave light emitting cells 100a and 100b.

The full-wave light emitting cell 200 and the half-wave light emitting cells 300 have the same structure as that of the half-wave light emitting cell 100a or 100b, except that each of them independently has a cathode terminal.

Meanwhile, sidewalls of the light emitting cells 100a, 100b, 200 and 300 are covered with an insulating layer 31. The insulating layer 31 insulates the light emitting cells from the wires 1221 and 2231. Although the insulating layer 31 may cover the transparent electrode layer 29, it is not limited thereto, but the insulating layer may have an opening through which the transparent electrode layer 29 is exposed. The insulating layer 31 may also cover the exposed surface of the substrate 21.

The basic unit 1000 described herein may be used in AC LEDs according to exemplary embodiments of the present invention, and a plurality of basic units may be connected to one another. The basic unit may also be modified to be suitable for a specific embodiment.

Figure 7:
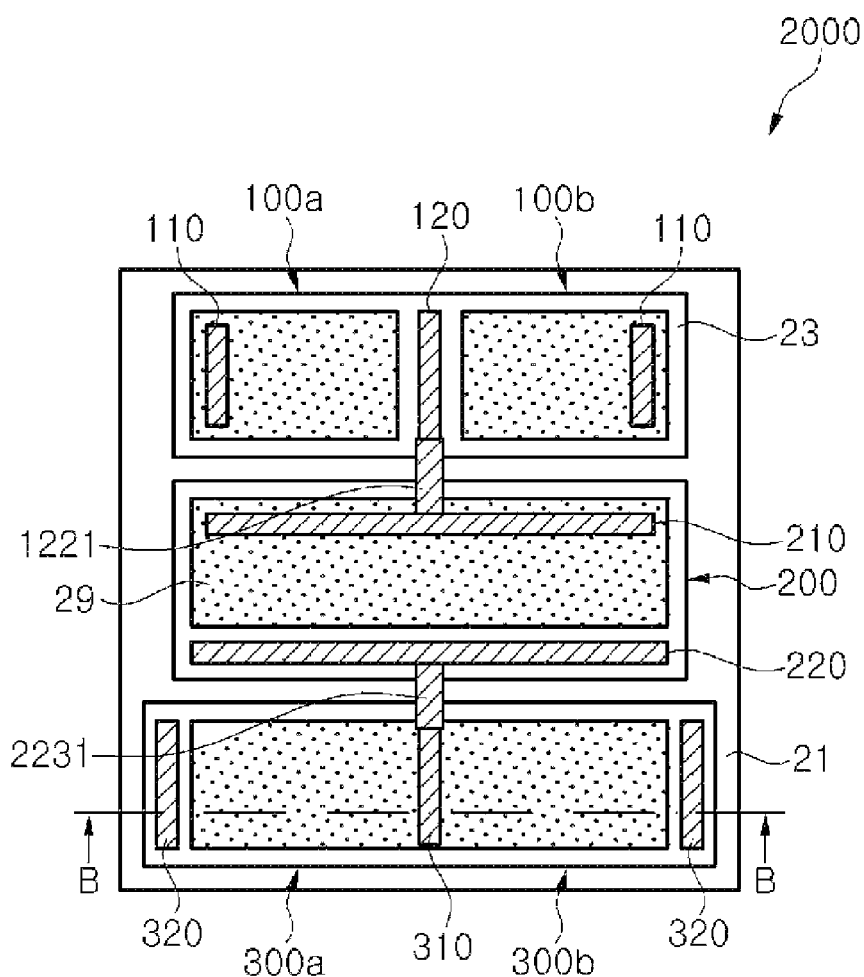
FIG. 7 is a plan view illustrating a modification of the basic unit of the light emitting cells available for the AC LEDs according to exemplary embodiments of the present invention.
Figure 8:
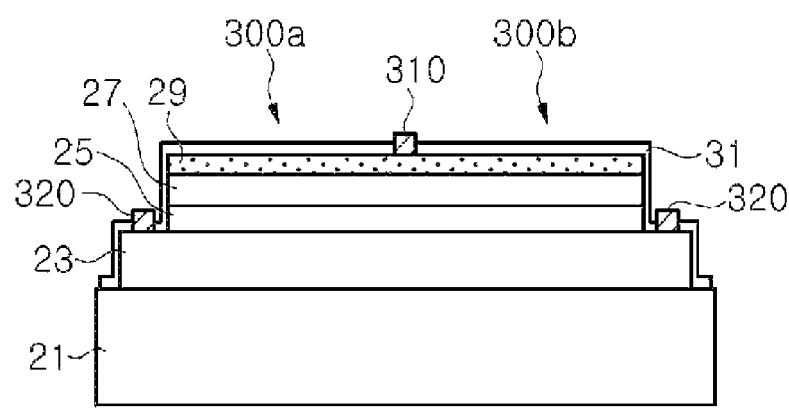
FIG. 8 is a sectional view taken along line B-B in FIG. 7.

FIG. 7 is a plan view illustrating a modification 2000 of the basic unit in the AC LEDs according to exemplary embodiments of the present invention. FIG. 8 is a sectional view taken along line B-B in FIG. 7.

Referring to FIGS. 7 and 8, the modification 2000 of the basic unit is almost similar to the basic unit 1000 described with reference to FIGS. 5 and 6. However, unlike the half-wave light emitting cells 300 of FIG. 5, half-wave light emitting cells 300a and 300b share an anode terminal 310. This means that the half-wave light emitting cells 300a and 300b share a lower semiconductor layer 23, an active layer 25, an upper semiconductor layer 27 and a transparent electrode layer 29. However, cathode terminals 320 are independently disposed to face each other.

A pair of half-wave light emitting cells 300a and 300b that share an anode terminal 310 may be used under a specific condition, e.g., under a condition that cathode terminals 320 are electrically connected to anode terminals of adjacent half-wave light emitting cells, respectively. This will be described in detail with reference to FIG. 13.

Figure 9:
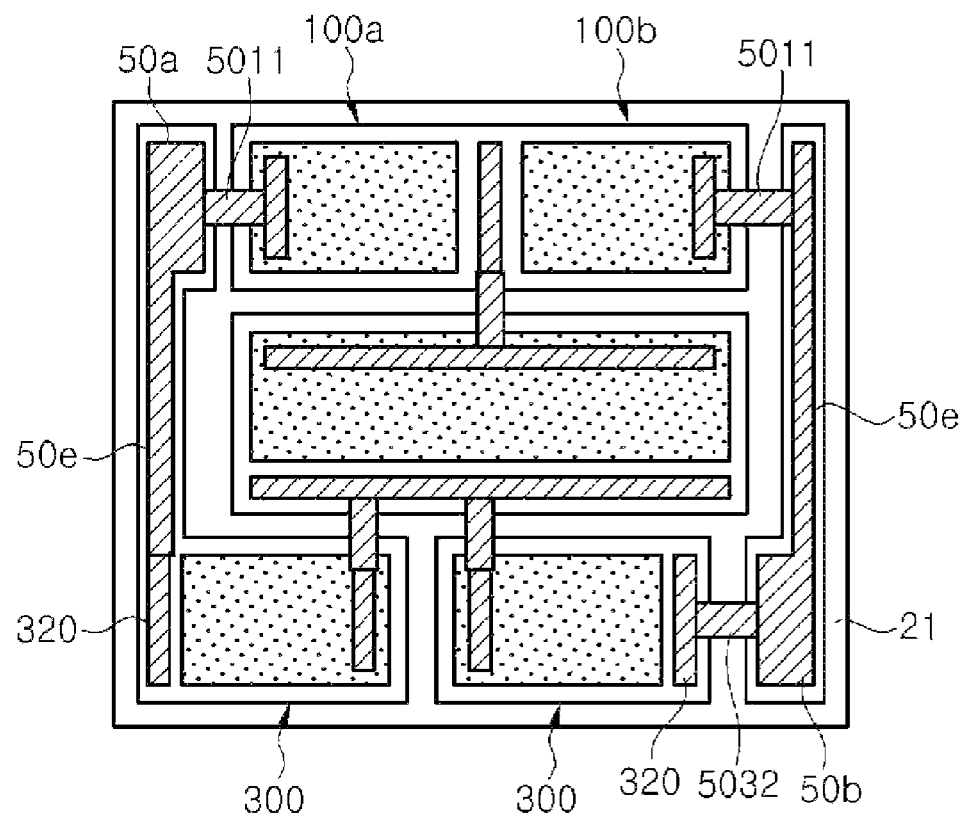
FIG. 9 is a plan view illustrating an AC LED according to a third exemplary embodiment of the present invention.
Figure 10:
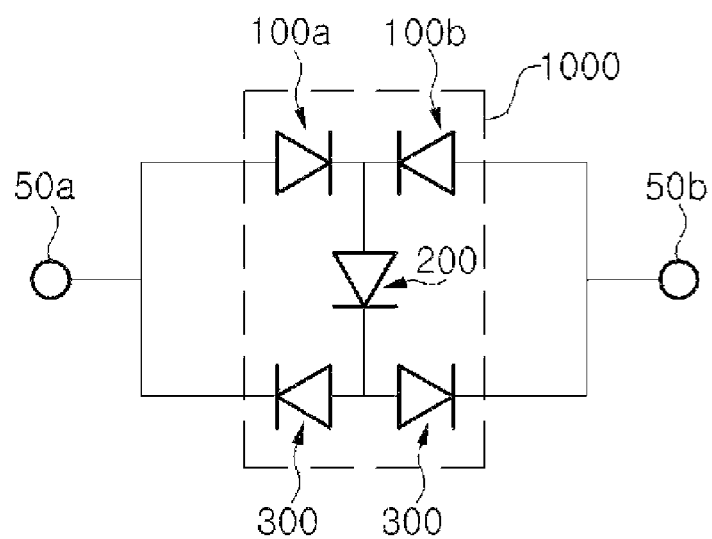
FIG. 10 is an equivalent circuit diagram of FIG. 9.

FIG. 9 is a plan view illustrating an AC LED according to a third exemplary embodiment of the present invention. FIG. 10 is an equivalent circuit diagram of FIG. 9. However, the AC LED having one basic unit 1000 will be described.

The AC LED according to the present exemplary embodiment includes the light is emitting cells 100a, 100b, 200 and 300 of the basic unit 1000 described with reference to FIGS. 5 and 6, and detailed descriptions will be omitted to avoid overlapped explanations.

Meanwhile, bonding pads 50a and 50b are positioned on a substrate 21. The bonding pads 50a and 50b are pads to which bonding wires and bumps are connected to flow AC current into the AC LED.

An anode terminal 110 of a half-wave light emitting cell 100a in a first row is electrically connected to the bonding pad 50a through a wire 5011, and a cathode terminal 320 of a half-wave light emitting cell 300 in a third row is electrically connected to the bonding pad 50*a*. Further, an anode terminal 110 of a half-wave light emitting cell 100*b* is electrically connected to the bonding pad 50*b* through a wire 5011, and a cathode terminal 320 of the other half-wave light emitting cell 300 is electrically connected to the bonding pad 50*b* through a wire 5032.

Bonding pad extension lines 50*e* may be extended from the bonding pads 50*a* and 50*b*, respectively. As shown in FIG. 9, the bonding pad extension line 50*e* extended from the bonding pad 50*a* may be electrically connected to the cathode terminal 320 of the half-wave light emitting cell 300, and the bonding pad extension line 50*e* extended from the bonding pad 50*b* may be electrically connected to the wire 5011 connected to the anode terminal 110 of the half-wave light emitting cell 100*b*.

The bonding pads 50*a* and 50*b* and the bonding pad extension lines 50*e* may be formed on a lower semiconductor layer 23 and, as a result, may be positioned on the same plane as that of the cathode terminals 120, 220 and 320. Further, the bonding pads 50*a* and 50*b*, the bonding pad extension lines 50*e* and the wires 5011, 5032, 1221 and 2231 may be formed together in the same process.

Although it has been described that the bonding pad 50*b* may be formed to be spaced apart from the other half-wave light emitting cell 300 and electrically connected to the cathode terminal of the other half-wave light emitting cell 300 through the wire 5032, it is not limited thereto, but the bonding pad 50*b* may be positioned at the position of the cathode terminal 320 of the other half-wave light emitting cell 300. Thus, it is unnecessary to separately form the cathode terminal 320 and the bonding pad 50*b*, so that the light emitting area of the other half-wave light emitting cell can be further increased.

Although it has been described that the bonding pad extension line 50*e* extended from the bonding pad 50*b* is electrically connected to the anode terminal of the half-wave light emitting cell 100*b* through the wire 5011, the bonding pad extension line 50*e* may be directly connected to the anode terminal 110 of the half-wave light emitting cell 100*b*. Thus, it is unnecessary to form the wire 5011 for connecting the half-wave light emitting cell 100*b* to the bonding pad extension line 50*e*, and accordingly, the half-wave light emitting cells 100*a* and 100*b* can be formed to have a larger size, thereby increasing the light emitting area of the half-wave light emitting cells.

Meanwhile, the distance between the anode terminal 110 and the cathode terminal 120 of each of the half-wave light emitting cells 100*a* and 100*b* may be substantially the same as the distance between the anode terminal 210 and the cathode terminal 220 of the full-wave light emitting cell 200 and the distance between the anode terminal 310 and the cathode terminal 320 of each of the half-wave light emitting cells 300. The distance between the anode and cathode terminals is equalized, so that forward voltages respectively applied to the light emitting cells 100*a*, 100*b*, 200 and 300 can be almost uniformly maintained.

The light emitting areas of the half-wave light emitting cells 100*a*, 100*b* and 300 is may be substantially the same, and the light emitting area of the full-wave light emitting cell 200 may be relatively larger than that of each of the half-wave light emitting cells. For example, the light emitting area of the full-wave light emitting cell 200 may be substantially the same as the sum of the light emitting areas of the half-wave light emitting cells 100*a* and 100*b* or the sum of the light emitting areas of the half-wave light emitting cells 300. Since the light emitting area of the full-wave light emitting cell 200 is relatively larger than that of each of the half-wave light emitting cells, the current density in the full-wave light emitting cell 200 can be relatively lowered. As the current density is lowered, the light emitting efficiency of the light emitting cell is enhanced. Thus, the light emitting efficiency of the full-wave light emitting cell 200 can be relatively enhanced, and accordingly, the entire light emitting efficiency of the LED can be enhanced.

Referring to FIG. 10, if an AC power source is connected to the bonding pads 50*a* and 50*b*, forward voltage is applied to the half-wave light emitting cell 100*a*, the full-wave light emitting cell 200 and one of the half-wave light emitting cells 300 between the bonding pads 50*a* and 50*b* during one half cycle, and forward voltage is applied to the half-wave light emitting cell 100*b*, the full-wave light emitting cell 200 and the other of the half-wave light emitting cells 300 between the bonding pads 50*a* and 50*b* during the other half cycle.

That is, when the AC LED according to the present exemplary embodiment operates, the full-wave light emitting cell 200 operates during a full cycle, and the half-wave light emitting cells 100*a*, 100*b* and 300 operate during a half cycle.

Meanwhile, reverse voltage is applied to the half-wave light emitting cell 100*b* and the other of the half-wave light emitting cells 300 during one half cycle of the AC driving, and reverse voltage is applied to the half-wave light emitting cell 100*a* and the one of the half-wave light emitting cells 300 during the other half cycle of the AC driving. At this time, the reverse voltage applied to the half-wave light emitting cells 100*a*, 100*b* and 300 is almost the same as the sum of the forward voltages respectively applied to one of the half-wave light emitting cells 100*a*, 100*b* and 300 and the full-wave light emitting cell 200. Thus, the reverse voltage applied to the half-wave light emitting cells can be limited not to exceed the sum of the forward voltages respectively applied to two light emitting cells, thereby enhancing reliability of the LED.

Here, although it has been described that the light emitting cells 100*a* and 100*b* share a cathode terminal, the light emitting cells 100*a* and 100*b* may share an anode terminal. In this case, the cathode terminals 120 are positioned on the light emitting cells 100*a* and 100*b* and electrically connected to the bonding pads 50*a* and 50*b*, respectively, and the full-wave light emitting cell 200 and the half-wave light emitting cells 300 are electrically connected in reverse directions.

Figure 11:
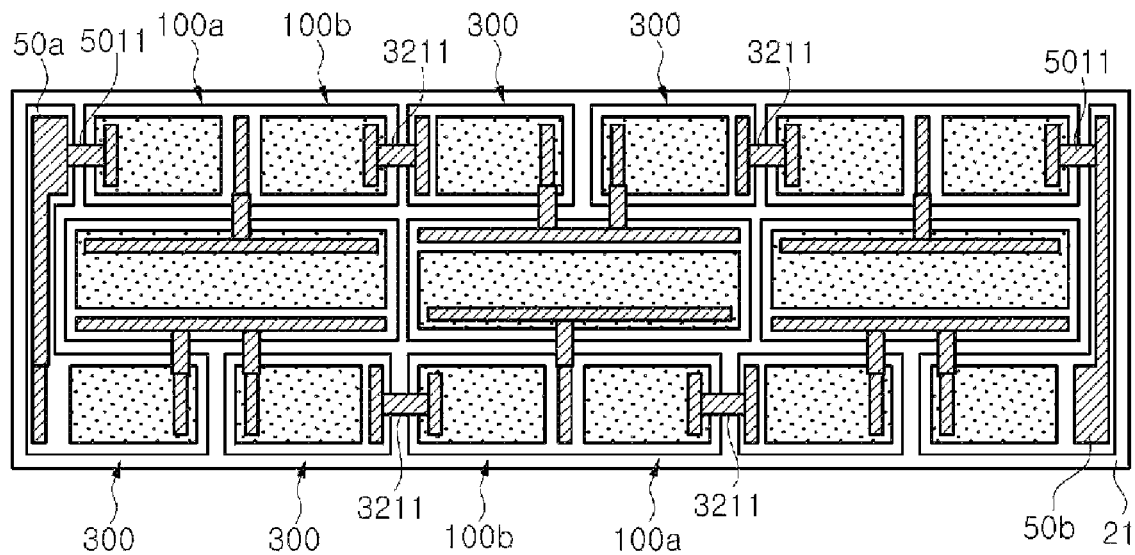
FIG. 11 is a plan view illustrating an AC LED according to a fourth exemplary embodiment of the present invention.
Figure 12:
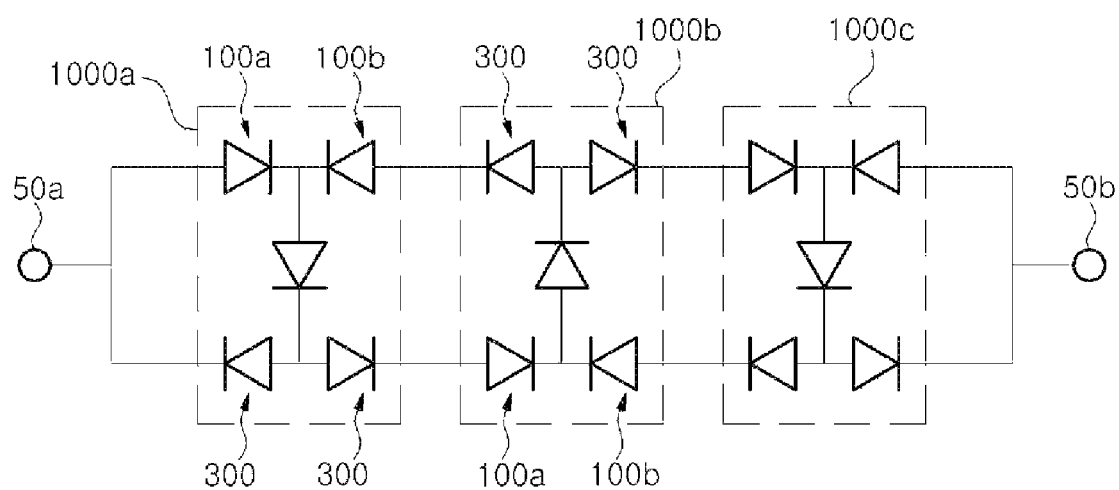
FIG. 12 is an equivalent circuit diagram of FIG. 11.

FIG. 11 is a plan view illustrating an AC LED according to a fourth exemplary embodiment of the present invention. FIG. 12 is an equivalent circuit diagram of FIG. 11.

Referring to FIG. 11, the AC LED according to the present exemplary embodiment has a structure in which three basic units of the light emitting cells of FIG. 5, i.e., first to third basic units 1000*a*, 1000*b* and 1000*c* (shown in FIG. 12), are connected in series, and bonding pads 50*a* and 50*b* are connected to both ends of the three basic units.

In the present embodiment, one basic unit connected to another basic unit is rotated by 180 degrees with respect to the another basic unit and connected to the another basic unit. That is, the first and third basic units 1000*a* and 1000*c* are respectively disposed at both ends of the second basic unit 1000*b*, and the second basic unit 1000*b* is rotated by 180 degrees with respect to the first and third basic units 1000*a* and 1000*c* and connected to the first and third basic units 1000*a* and 1000*c*.

Specifically, each of the first and third basic units has light emitting cells 100*a*, 100*b*, 200 and 300 arranged in the same structure as that of the basic unit described in FIG. 5. That is, the half-wave light emitting cells 100*a* and 100*b* are disposed in a first row, the full wave light emitting cell 200 is disposed in a second row, and the half-wave light emitting cells 300 are disposed in a third row.

On the contrary, the second basic unit 1000*b* has light emitting cells 100*a*, 100*b*, 200 and 300 arranged in a structure rotated by 180 degrees with respect to the basic unit described in FIG. 5. That is, in the second basic unit, the pair of half-wave light emitting cells 300 each having anode and cathode terminals 310 and 320 are disposed in a first row, the full-wave light emitting cell 200 is disposed in a second row, and the pair of half-wave light emitting cells that share a cathode terminal are disposed in a third row. The full-wave light emitting cell 200 is positioned between the pair of half-wave light emitting cells 300 in the first row and the pair of half-wave light emitting cells 100*a* and 100*b* in the third row. An anode terminal 210 of the full-wave light emitting cell 200 is electrically connected to the cathode terminal 120 shared by the pair of half-wave light emitting cells 100*a* and 100*b* in the third row, and a cathode terminal 220 of the full-wave light emitting cell 200 is electrically connected to the anode terminals 320 of the pair of half-wave light emitting cells 300 in the first row.

Meanwhile, the cathode terminal 320 of one of the pair of half-wave light emitting cells 300 of the second basic unit 1000*b* is electrically connected to the anode terminal of the half-wave light emitting cell 100*b* of the first basic unit 1000*a* through a wire 3211, and the anode terminal 110 of the half-wave light emitting cell 100*b* of the second basic unit 1000*b* is is electrically connected to the cathode terminal 320 of one of the pair of light emitting cells 300 of the first basic unit 1000*a* through a wire 3211. Further, the cathode terminal 320 of the other of the pair of half-wave light emitting cells 300 of the second basic unit 1000*b* is electrically connected to the anode terminal 110 of the half-wave light emitting cell 100*a* of the third basic unit 1000*c* through a wire 3211, and the anode terminal 110 of the half-wave light emitting cell 100*a* of the second basic unit 1000*b* is electrically connected to the cathode terminal 320 of one of the pair of half-wave light emitting cells 300 of the third basic unit 1000*c* through a wire 3211.

As described with reference to FIG. 9, the bonding pad 50*a* is electrically connected to the half-wave light emitting cells 100*a* and 300 of the first basic unit 1000*a*, and the bonding pad 50*b* is electrically connected to the third basic unit 1000*c*. Here, it is shown that the bonding pad 50*b* is formed at the position of the cathode terminal 320 of the half-wave light emitting cell 300 of the third basic unit 1000*c*.

In the present exemplary embodiment, by employing a structure in which adjacent basic units are connected to each other after rotating a basic unit by 180 degrees, the size of the wires 3211 that connect the basic units can be decreased, so that decrease of the light emitting area for forming wires can be reduced, thereby preventing decrease of the light emitting area.

Referring to FIG. 12, if an AC power source is connected to the bonding pads 50*a* and 50*b*, the half-wave light emitting cells 100*a*, 100*b* and 300 are driven during a half cycle, and the full-wave light emitting cells 200 are driven during a full cycle.

Meanwhile, reverse voltage is applied to some of the half-wave light emitting cells during the half cycle when the AC power source is connected and the half-wave light emitting cells are driven. At this time, the reverse voltage applied to two half-wave light is emitting cells 100*b* and 300; or 100*a* and 300 positioned between the full-wave light emitting cells 200 is almost the same as the sum of the forward voltages respectively applied to two full-wave light emitting cells 200 and two half-wave light emitting cells 100*b* and 300; or 100*a* and 300. Thus, similarly to as described with reference to FIG. 10, the reverse voltage applied to each of the half-wave light emitting cells can be limited not to exceed the sum of the forward voltages respectively applied to the two light emitting cells, thereby enhancing the reliability of the LED.

Although it has been described in the present exemplary embodiment that three basic units are connected in series between the bonding pads 50*a* and 50*b*, the number of basic units is not particularly limited.

Figure 13:
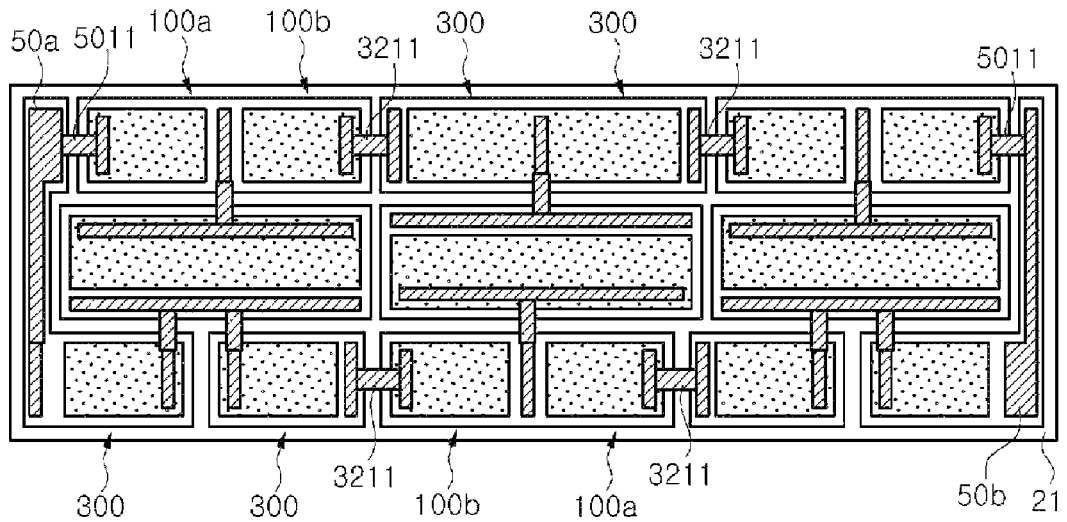
FIG. 13 is a plan view illustrating an AC LED according to a fifth exemplary embodiment of the present invention.

FIG. 13 is a plan view illustrating an AC LED according to a fifth exemplary embodiment of the present invention.

Referring to FIG. 13, the AC LED according to the present exemplary embodiment is almost similar to the AC LED described with reference to FIG. 11. However, the AC LED according to this embodiment is different from that described with reference to FIG. 11 in that a second basic unit 1000*b* positioned between first and third basic units 1000*a* and 1000*c* has a modified shape of the basic unit 2000 described with reference to FIG. 7.

That is, the second basic unit 1000*b* has a shape of the first or third basic unit rotated by 180 degrees, but half-wave light emitting cells 300*a* and 300*b* of the second basic unit 1000*b* share an anode terminal 310 as described in FIG. 7.

In the AC LED of the present exemplary embodiment, half-wave light emitting cells 300 of one basic unit positioned between other basic units may share an anode terminal 310.

By employing the half-wave light emitting cells 300*a* and 300*b* that share the is anode terminal 310, it is unnecessary to separate the half-wave light emitting cells, and the area for forming the anode terminal 310 can be decreased. Thus, the light emitting area can be further increased.

Figure 14:
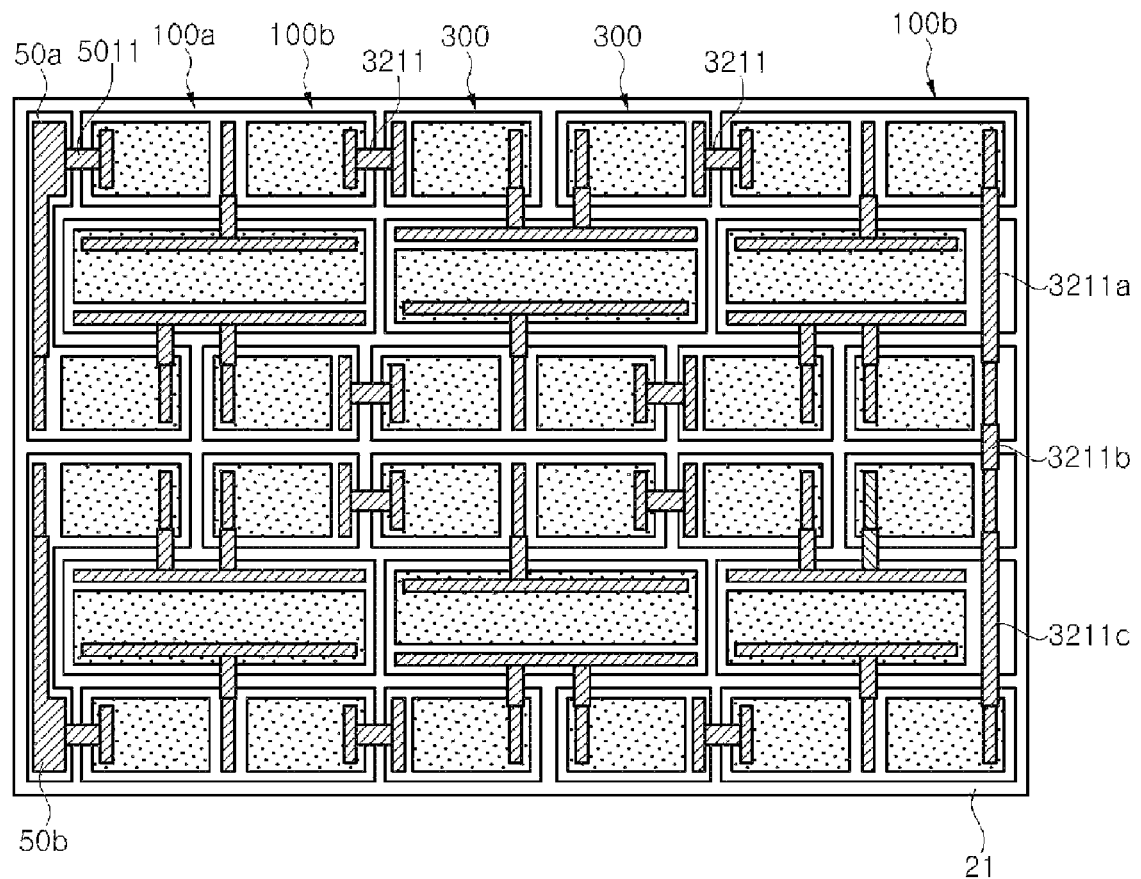
FIG. 14 is a plan view illustrating an AC LED according to a sixth exemplary embodiment of the present invention.
Figure 15:
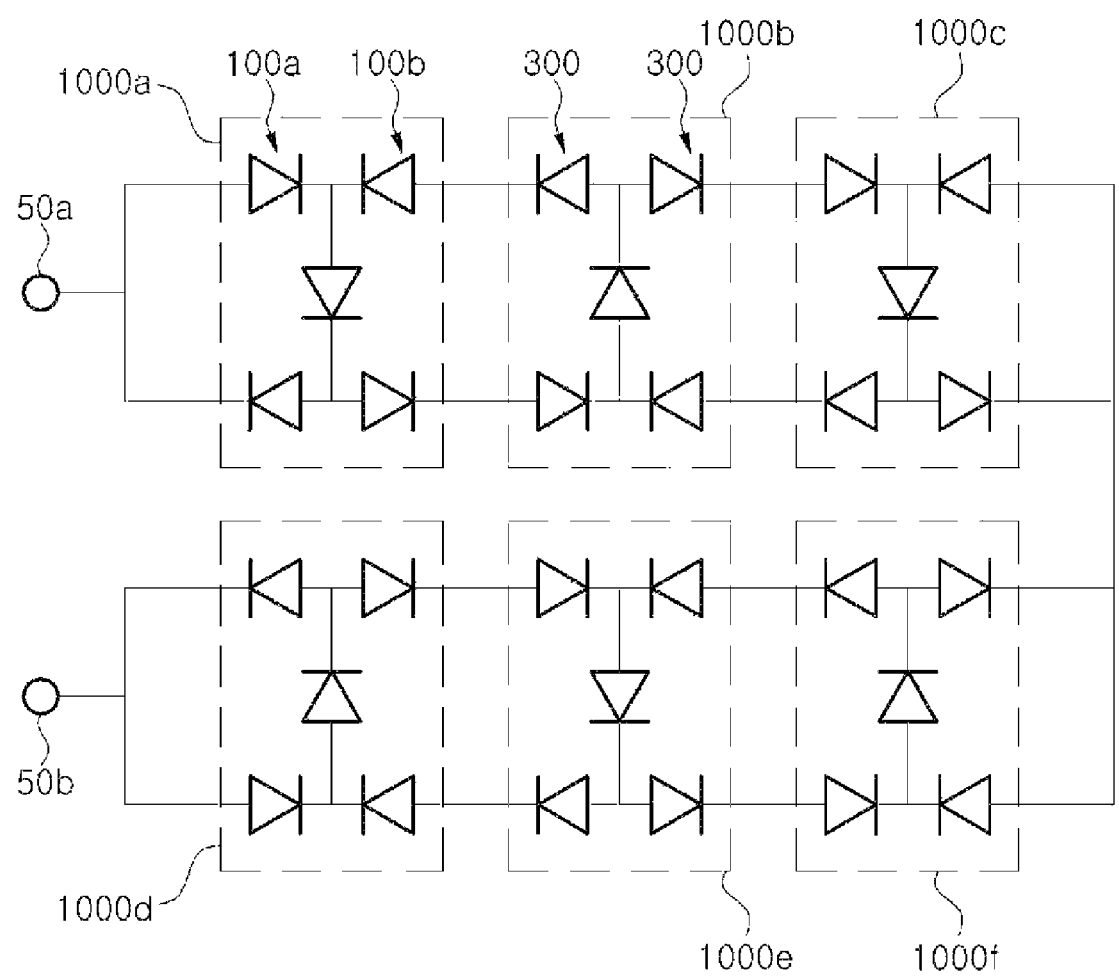
FIG. 15 is an equivalent circuit diagram of FIG. 14.

FIG. 14 is a plan view illustrating an AC LED according to a sixth exemplary embodiment of the present invention. FIG. 15 is an equivalent circuit diagram of FIG. 14.

Referring to FIGS. 14 and 15, first to third basic units 1000*a*, 1000*b* and 1000*c* are connected as described with reference to FIG. 11. In addition, fourth to sixth basic units 1000*d*, 1000*e* and 1000*f* are connected in a different row. It is preferable that the number of the basic units in one row is the same as that of the basic units in another row.

The fourth to sixth basic units 1000*d*, 1000*e* and 1000*f* are arranged in a mirror symmetrical shape with respect to the first to third basic units 1000*a*, 1000*b* and 1000*c*, and bonding pads 50*a* and 50*b* are connected to the first and fourth basic units 1000*a* and 1000*d*, respectively.

An anode terminal 310 of a half-wave light emitting cell 100*b* of the third basic unit 1000*c* is electrically connected to a cathode terminal 320 of one of half-wave light emitting cells 300 of the sixth basic unit 1000*f*, and a cathode terminal 320 of one of half-wave light emitting cells 300 of the third basic unit 1000*c* is electrically connected to an anode terminal 110 of a half-wave light emitting cell 100*b* of the sixth basic unit 1000*f*. Here, the anode terminal 310 of the half-wave light emitting cell 100*b* of the third basic unit 1000*c* and the cathode terminal 320 of the half-wave light emitting cell 300 of the sixth basic unit 1000*f*; and the cathode terminal 320 of the half-wave light emitting cell 300 of the third basic unit 1000*c* and the anode terminal 110 of the half-wave light emitting cell 100*b* of the sixth basic unit 1000*f* may be electrically connected through wires in various manners.

For example, a wire 3211*a* may connect the anode terminal 110 of the half-wave light emitting cell 100*b* of the third basic unit 1000*c* and the cathode terminal 320 of the half-wave light emitting cell 300 of the third basic unit 1000*c* to each other, and a wire 3211*c* may connect the anode terminal 110 of the half-wave light emitting cell 100*b* of the sixth basic unit 1000*f* and the cathode terminal 320 of the half-wave light emitting cell 300 of the sixth basic unit 1000f to each other. Further, a wire 3211b may connect the cathode terminal 320 of the half-wave light emitting cell 300 of the third basic unit 1000c and the cathode terminal 320 of the half-wave light emitting cell 300 of the sixth basic unit 1000f. Accordingly, the half-wave light emitting cells 100b and 300 of the third basic unit 1000c and the half-wave light emitting cells 100b and 300 of the sixth basic unit 1000f are electrically connected.

As shown in FIG. 14, the wires 3211a and 3211b may cross over the top of a lower semiconductor layer 23 of full-wave lighting cells 200 and are insulated from the full-wave light emitting cells 200 by an insulating layer 31.

In the present exemplary embodiment, the half-wave light emitting cells 300 of the third and sixth basic units connected by the wire 3211b may share the lower semiconductor layer 23 and a cathode terminal. Therefore, in a case where the cathode terminal 320 is formed, the formation of the wire 3211b may be omitted.

In this exemplary embodiment, the half-wave light emitting cells of the second and fifth basic units 1000b and 1000e may share an anode terminal as described with reference to FIG. 13.

Figure 16:
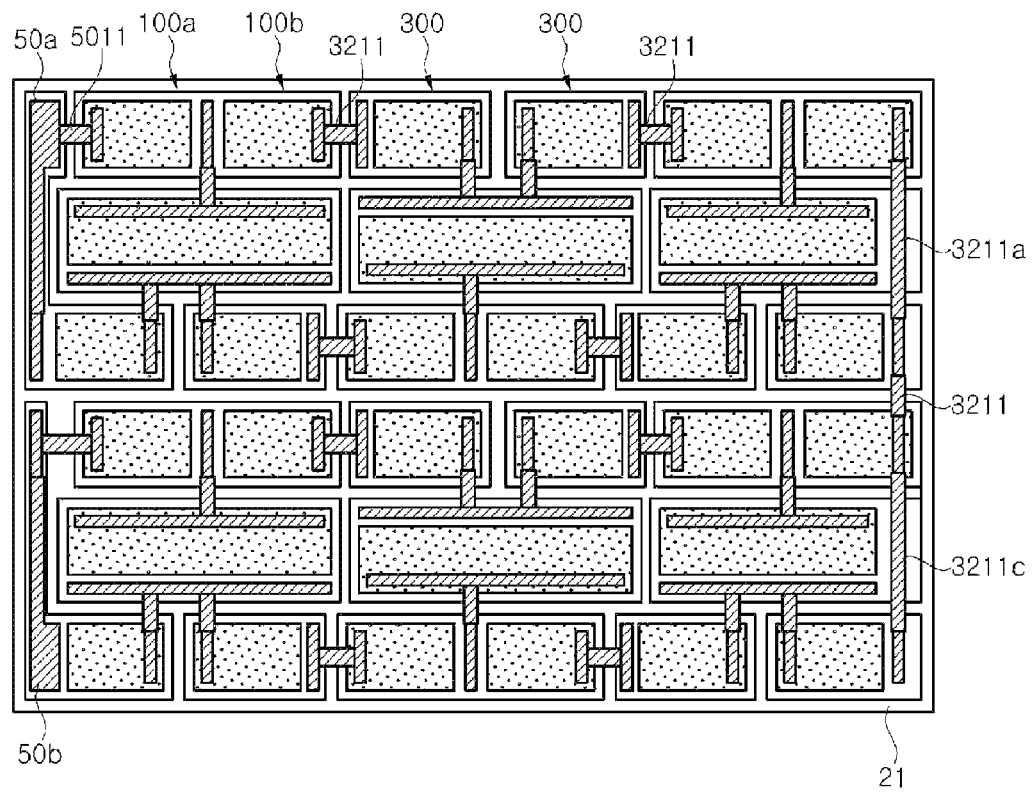
FIG. 16 is a plan view illustrating an AC LED according to a seventh exemplary embodiment of the present invention.
Figure 17:
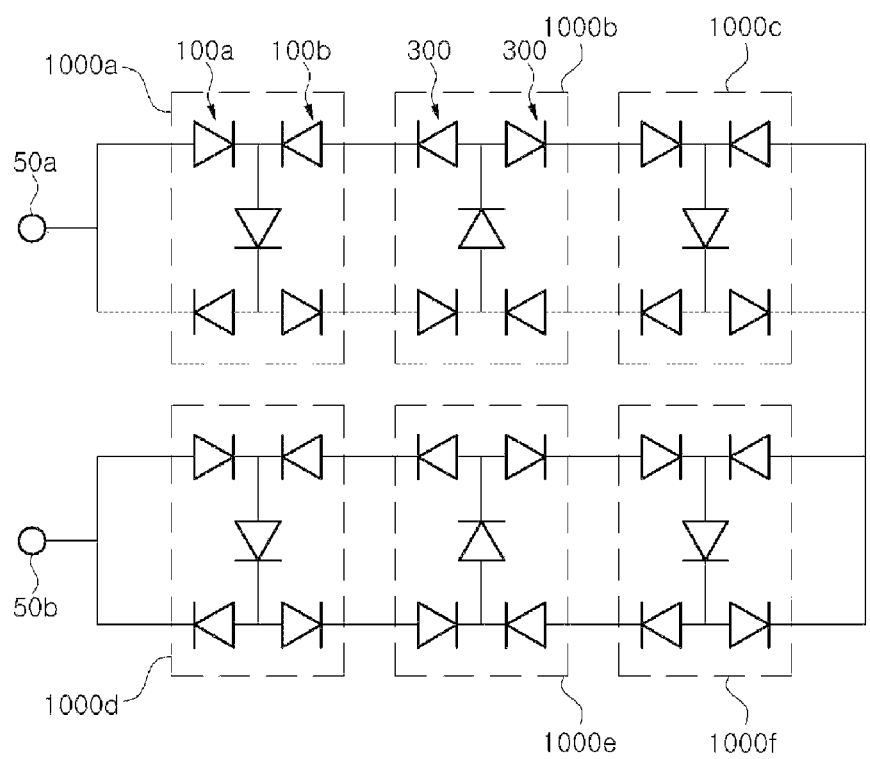
FIG. 17 is an equivalent circuit diagram of FIG. 16.

FIG. 16 is a plan view illustrating an AC LED according to a seventh exemplary embodiment of the present invention. FIG. 17 is an equivalent circuit diagram of FIG. 16.

Referring to FIGS. 16 and 17, the AC LED according to the present exemplary is embodiment is almost similar to the AC LED described with reference to FIG. 14. However, the AC LED according to this exemplary embodiment is different from the AC LED described with reference to FIG. 14 in that fourth to sixth basic units 1000d to 1000f are arranged with the same structure as that of the first to third basic units in a different row. That is, the first to third basic units 1000a to 1000c are repeated in another row.

As described with reference to FIG. 14, a wire 3211a may connect an anode terminal 110 of a half-wave light emitting cell 100b of the third basic unit 1000c and a cathode terminal 320 of one of half-wave light emitting cells 300 of the third basic unit to each other, and a wire 3211c may connect an anode terminal 110 of a half-wave light emitting cell 100b of the sixth basic unit 1000f and a cathode terminal 320 of one of half-wave light emitting cells 300 of the sixth basic unit to each other. A wire 3211 connects the cathode terminal 320 of the half-wave light emitting cell 300 of the third basic unit 1000c and the anode terminal 110 of the half-wave light emitting cell 100b of the sixth basic unit 1000f. Accordingly, the half-wave light emitting cells 100b and 300 of the third basic unit 1000c and the half-wave light emitting cells 100b and 300 of the sixth basic unit 1000f are electrically connected.

According to the present exemplary embodiment, there may be provided an AC LED similar to the AC LED described with reference to FIG. 14.

In this exemplary embodiment, the half-wave light emitting cells 300 of the second and fifth basic units 1000b and 1000e may share an anode terminal as described with reference to FIG. 13.

Figure 18:
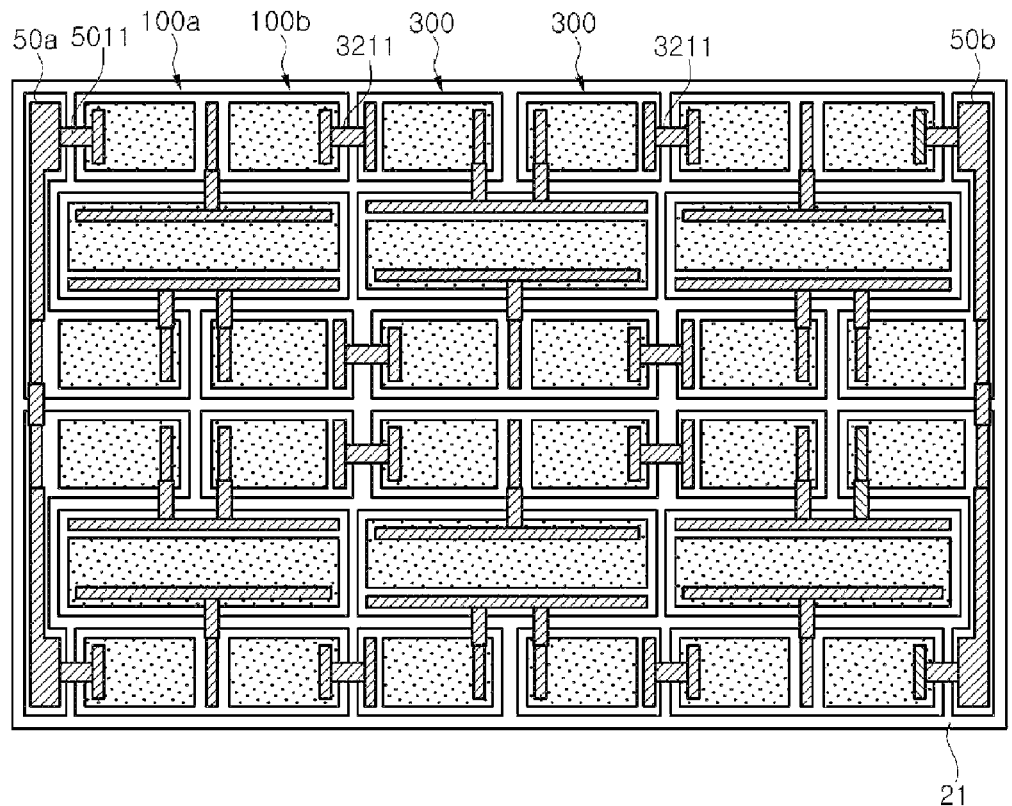
FIG. 18 is a plan view illustrating an AC LED according to an eighth exemplary embodiment of the present invention.
Figure 19:
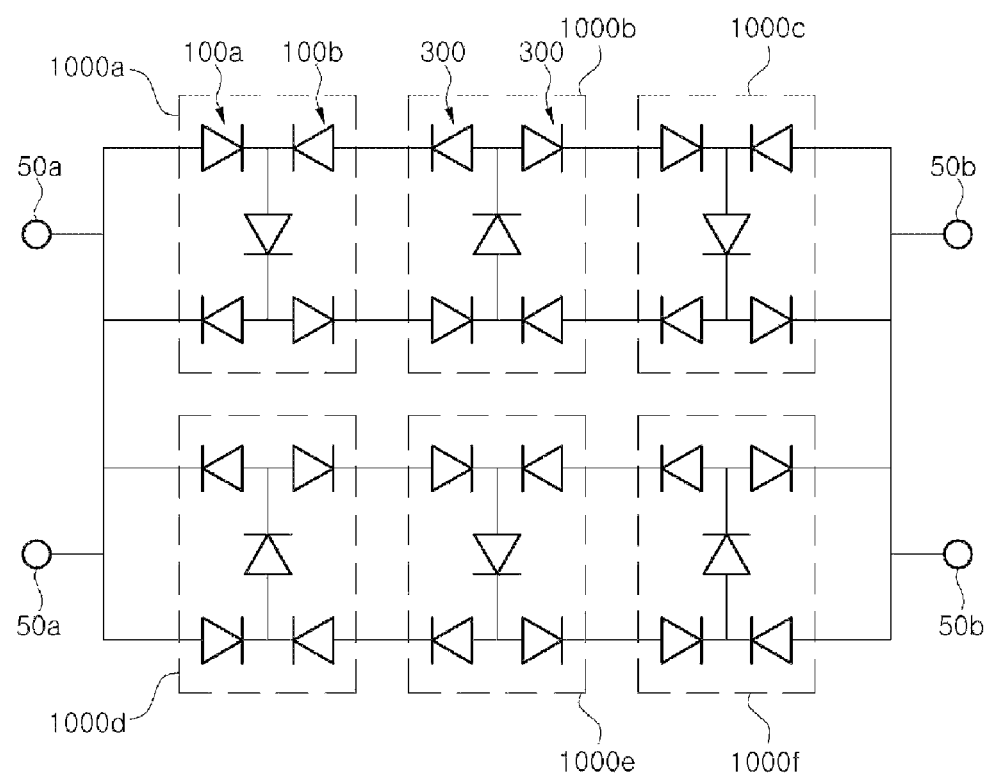
FIG. 19 is an equivalent circuit diagram of FIG. 18.

FIG. 18 is a plan view illustrating an AC LED according to an eighth exemplary embodiment of the present invention. FIG. 19 is an equivalent circuit diagram of FIG. 18.

Referring to FIGS. 18 and 19, basic units 1000a to 1000f are arranged on a is substrate 21 as described with reference to FIG. 14. First to third basic units and fourth to sixth basic units may have a minor symmetrical structure.

Meanwhile, the first and fourth basic units 1000a and 1000d are commonly connected to a bonding pad 50, and the third and sixth basic units 1000c and 1000f are commonly connected to a bonding pad 50b.

That is, an anode terminal 110 of a half-wave light emitting cell 100a and a cathode terminal 320 of one of half-wave light emitting cells 300 in the first basic unit 1000a and an anode terminal 110 of a half-wave light emitting cell 100a and a cathode terminal 320 of one of half-wave light emitting cells 300 in the fourth basic unit 1000d are commonly and electrically connected to the bonding pad 50a, and an anode terminal 110 of a half-wave light emitting cell 100b and a cathode terminal 320 of one of half-wave light emitting cells 300 in the third basic unit 1000c and an anode terminal 110 of a half-wave light emitting cell 100b and a cathode terminal 320 of one of half-wave light emitting cells 300 in the sixth basic unit 1000f are commonly and electrically connected to the bonding pad 50b.

Accordingly, there is provided an AC LED in which the first to third basic units 1000a to 1000c and the fourth to sixth basic units 1000d to 1000f are connected in parallel between the bonding pads 50a and 50b.

Each of the bonding pads 50a and 50b may be formed by one, but two or more of respective bonding pads may be formed as shown in the figure.

Although it has been described in present exemplary embodiment that the first to third basic units and the fourth to sixth basic units are arranged in a mirror symmetrical structure, the fourth to sixth basic units may be arranged in the same manner as the first to third basic units are arranged as described with reference to FIG. 16.

In this exemplary embodiment, the half-wave light emitting cells 300 of the second and fifth basic units 1000b and 1000e may share an anode terminal as described with reference to FIG. 13.

In the present exemplary embodiment, the half-wave light emitting cells 300 of the third and sixth basic units may share a lower semiconductor layer 23 and a cathode terminal. Therefore, in a case where the cathode terminal 320 is formed, the formation of wires that connect the third and sixth basic units may be omitted. The half-wave light emitting cells 300 of the first and fourth basic units may also share a lower semiconductor layer 23 and a cathode terminal. Therefore, the formation of wires that connect the first and fourth basic units may be omitted.

Figure 20:
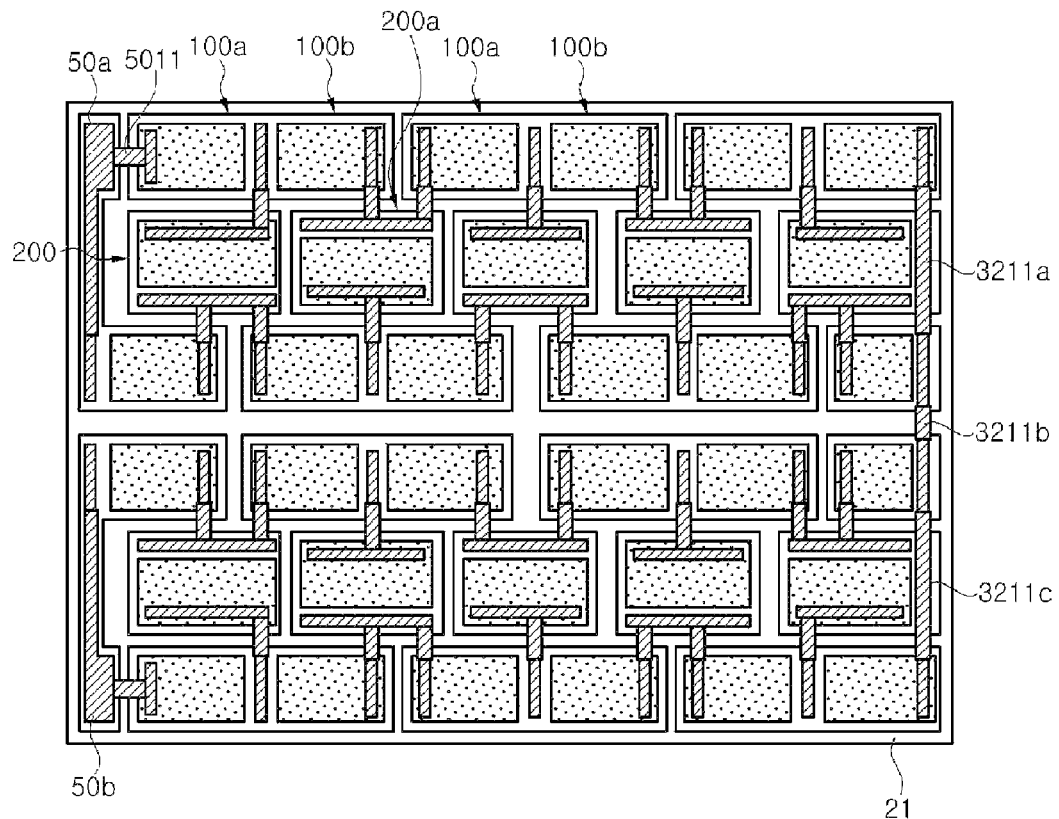
FIG. 20 is a plan view illustrating an AC LED according to a ninth exemplary embodiment of the present invention.
Figure 21:
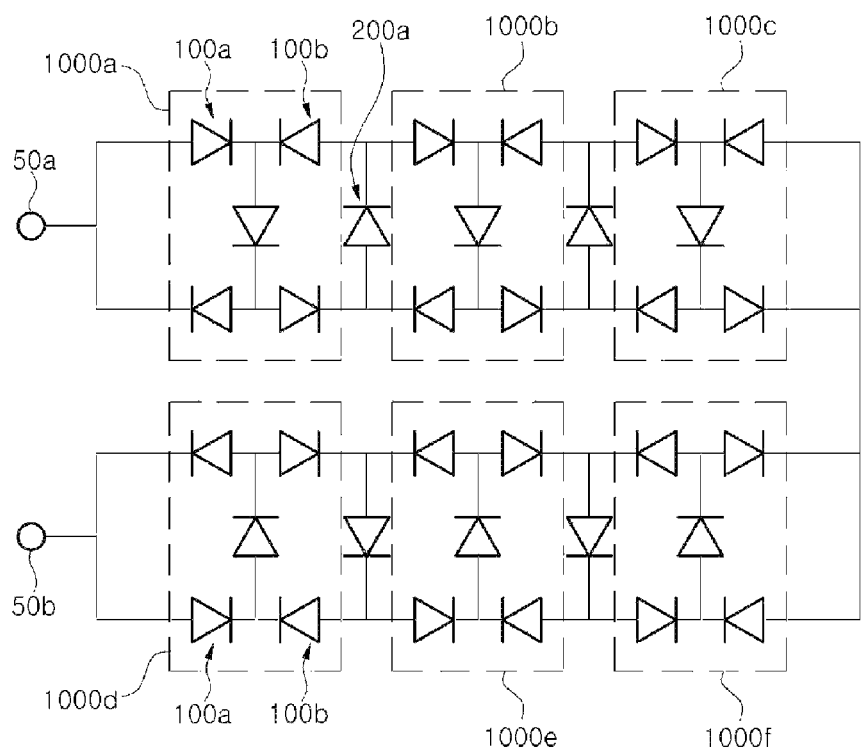
FIG. 21 is an equivalent circuit diagram of FIG. 20.

FIG. 20 is a plan view illustrating an AC LED according to a ninth exemplary embodiment of the present invention. FIG. 21 is an equivalent circuit diagram of FIG. 20.

Referring to FIGS. 20 and 21, first to third basic units 1000a to 1000c and fourth to sixth basic units 1000d to 1000f are arranged in different rows. In the aforementioned embodiments, the second basic unit is connected to the first and third basic units 1000a and 1000c by being rotated by 180 degrees with respect to the first and third basic units. However, in this exemplary embodiment, the second basic unit 1000b is connected to the first and third basic units 1000a and 1000c in the same structure as that of the first and third basic units, and the fifth basic unit 1000e is connected to the fourth and sixth basic units 1000d and 1000f in the same structure as that of the fourth and sixth basic units.

Meanwhile, half-wave light emitting cells 300 in each of the basic units are separated from each other, and adjacent half-wave light emitting cells 300 may share a cathode terminal 320. Thus, the light emitting area can be increased.

Meanwhile, adjacent basic units are connected to each other though an additional full-wave light emitting cell 200a. That is, an anode terminal 110 of a half-wave light emitting cell 100b of the first basic unit 1000a and an anode terminal 110 of a half-wave light emitting cell 100a of the second basic unit 1000b are electrically connected to a cathode terminal 220 of the additional full-wave light emitting cell 200a, and the cathode terminal 320 shared by one of half-wave light emitting cells 300 of the first basic unit 1000a and one of half-wave light emitting cells 300 of the second basic unit 1000b is electrically connected to an anode terminal 220 of the additional full-wave light emitting cell 200a. An additional full-wave light emitting cell 200a is interposed between the second and third basic units 1000b and 1000c to connect the second and third basic units to each other, and the fourth and sixth basic units are also connected to each other through an additional full-wave light emitting cell 200a.

The positions of the cathode and anode terminals of each of the additional full-wave light emitting cells 200a are disposed to be opposite to those of each full-wave light emitting cell 200 in the basic units. Accordingly, the full-wave light emitting cells 200 in the basic units and the additional full-wave light emitting cells 200a are alternately disposed.

Meanwhile, the third and sixth basic units 1000c and 1000f may be electrically connected to each other through wires 3211a to 3211c as described with reference to FIG. 14.

In this exemplary embodiment, half-wave light emitting cells 300 of the third and sixth basic units connected by the wire 3211b may share a lower semiconductor layer 23 and a cathode terminal. Therefore, in a case where the cathode terminal is formed, the formation of the wire 3211b may be omitted.

Although it has been described in this exemplary embodiment that the first to third basic units and the fourth to sixth basic units are arranged in a mirror symmetrical structure, is the fourth to sixth basic units may be arranged in the same manner as the first to third basic units is arranged as described above.

According to the present exemplary embodiment, the basic units are connected to each other using the additional full-wave light emitting cells 200a, so that the number of light emitting cells connected in series between the bonding pads 50a and 50b can be increased in a limited chip area. Thus, there is provided an LED capable of being driven under high-voltage AC power.

According to exemplary embodiments of the present invention, the light emitting area of an LED can be increased by employing pairs of light emitting cells that share a cathode electrode. Also, although full-wave light emitting cells are employed, reverse voltage applied to half-wave light emitting cells does not exceed the sum of forward voltages respectively applied to two light emitting cells, thereby ensuring the reliability of an LED. Also, half-wave light emitting cells are electrically connected to each other through a wire that crosses the row of the full-wave light emitting cells, thereby providing an LED having an improved array structure. Also, half-wave light emitting cells are electrically connected using a wire that crosses over the full-wave light emitting cell or a connection pad formed on top of the full-wave light emitting cell, thereby increasing the light emitting area of the full-wave light emitting cell.

Also, basic units in which full-wave light emitting cells are disposed between pairs of half-wave light emitting cells are connected to each other, so that reverse voltages respectively applied to the half-wave light emitting cells can be maintained almost the same as forward voltage applied to two light emitting cells. Also, light emitting cells are connected to each other using units of light emitting cells having a specific structure, so that light emitting cells can be highly integrated in a unit area. Also, forward voltages are maintained almost the is same among light emitting cells by equalizing the distance between electrodes of the light emitting cells, thereby enhancing reliability of an LED.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An alternating current (AC) light emitting diode (LED) apparatus comprising:
   a substrate;
   a first bonding pad disposed on the substrate and configured to receive a first voltage;
   a second bonding pad disposed on the substrate and configured to receive a second voltage;
   a first row of LEDs disposed on the substrate and electrically connected to the first and second bonding pads, a portion of the LEDs configured to emit light only when the first voltage is received, and the remaining LEDs configured to emit light only when the second voltage is received;
   a second row of LEDs disposed on the substrate, electrically connected to the first and second bonding pads, and configured to emit light when the first voltage is received and when the second voltage is received;
   a third row of LEDs disposed on the substrate and electrically connected to the first and second bonding pads, a portion of the LEDs configured to emit light only when the second voltage is received, and the remaining LEDs configured to emit light only when the first voltage is received; and
   a first conductor to directly electrically connect anode terminals of a corresponding pair of the LEDs in the first row with cathode terminals of a corresponding pair of the LEDs in the third row, the first conductor being electrically insulated from the LEDs in the second row,
   wherein the second row is arranged between the first row and the third row.

2. The AC LED apparatus of claim 1, wherein the first conductor crosses over at least one of the LEDs in the second row.

3. The AC LED apparatus of claim 2, further comprising second conductors, each second conductor to directly electrically connect cathodes of a corresponding pair of LEDs in the first row with an anode of a corresponding LED in the second row.

4. The AC LED apparatus of claim 3, wherein:
   the number of the LEDs in the third row is the same as the number of the LEDs in the first row; and
   the AC LED apparatus further comprises third conductors, each third conductor to directly electrically connect anode terminals of a corresponding pair of LEDs in the third row to a cathode terminal of a corresponding LED in the second row.

5. The AC LED apparatus of claim 4, further comprising a plurality of the first conductors, each or the first conductors to directly electrically connect anode terminals of a corresponding pair of the LEDs in the first row with cathode terminals of a corresponding pair of LEDs in the second row.

6. The AC LED apparatus of claim 4, wherein:
   the cathode terminal of the LED arranged at a first end of the third row is directly electrically connected to the first bonding pad;
   the cathode terminal of the LED arranged at an opposing second end of the third row is directly electrically connected to the anode terminal of a corresponding LED in the first row through a conductor that is electrically insulated from and crosses over one of the LEDs in the second row; and the anode terminal of the LED arranged at a first end of the first row is directly electrically connected to the first bonding pad.

7. The AC LED apparatus of claim 2, wherein:
each of the LEDs comprises a lower semiconductor layer, an active layer, and an upper semiconductor layer; and
an insulating layer is arranged between the first conductor and the lower semiconductor layer of an LED in the second row.

8. The AC LED apparatus of claim 2, wherein:
each of the LEDs comprises a lower semiconductor layer, an active layer, and an upper semiconductor layer; and
an insulating layer is arranged between the first conductor and the upper semiconductor layer of an LED in the second row.

9. The AC LED apparatus of claim 5, wherein the first conductors have a higher resistance than that of the second conductors or the third conductors.

10. The AC LED apparatus of claim 2, wherein the first conductor comprises indium tin oxide (ITO) or poly-silicon.

11. An alternating current (AC) light emitting diode (LED) apparatus comprising:
a substrate;
a first bonding pad disposed on the substrate and configured to receive a first voltage;
a second bonding pad disposed on the substrate and configured to receive a second voltage;
a basic unit electrically connected between the first and second bonding pads, the basic unit comprising:
    a pair of first LEDs, one of the first LEDs configured to emit light only when the first voltage is received and the other of the first LEDs configured to emit light only when the second voltage is received;
    a pair of second LEDs, one of the second LEDs configured to emit light only when the first voltage is received and the other second LEDs configured to emit light only when the second voltage is received; and
    a third LED disposed between and directly electrically connected to the first LEDs and the second LEDs, the third LED configured to emit light when the first voltage is received and when the second voltage is receive;
a first conductor to directly electrically connect cathode terminals of the first LEDs with an anode terminal of the third LED; and
a second conductor to directly electrically connect anode terminals of the second LEDs with a cathode terminal of the third LED.

12. The AC LED apparatus of claim 11, wherein the distances between an anode terminal and a cathode terminal of the pair of first LEDs, an anode terminal and a cathode terminal of the third LED, and an anode terminal and a cathode terminal of the pair of second LEDs are the same.

13. The AC LED apparatus of claim 11, wherein:
the apparatus further comprises two of the basic units, a first one of the basic units being disposed adjacent to a second one of the basic units, with the second basic unit being rotated by 180 degrees with respect to the first basic unit, such that the first LEDs of the first basic unit and the second LEDs of the second basic unit are disposed in a first row, the second LEDs of the first basic unit and the first LEDs of the second basic unit are disposed in a second row, and the third LEDs of the first and second basic units are disposed between the first and second rows;
a cathode terminal of one of the first LEDs of the first basic unit is directly electrically connected to the anode terminal of one of the second LEDs of the second basic unit; and
an anode terminal of one of the second LEDs of the first basic unit is directly electrically connected to a cathode terminal of one of the first LEDs of the second basic unit.

14. The AC LED apparatus of claim 11, wherein the apparatus further comprises:
two of the basic units, a first one of the basic units being disposed adjacent to a second one of the basic units; and
a fourth LED disposed between the first and second basic units and configured to emit light when the first voltage is received and when the second voltage is received, wherein,
the first LEDs are disposed in a first row,
the second LEDs are disposed in a second row,
the third and fourth LEDs are disposed in a third row,
a cathode of the fourth LED is directly electrically connected to an anode terminal of one of the first LEDs of the first basic unit and to an anode terminal of one of the first LEDs of the second basic unit, and
an anode terminal of the fourth LED is directly electrically connected to a cathode terminal of one of the second LEDs of the first basic unit and to a cathode terminal of one of the second LEDs of the second basic unit.

15. The AC LED apparatus of claim 14, further comprising a third one of the basic units that is electrically connected to the second basic unit.

16. An alternating current (AC) light emitting diode (LED) apparatus comprising:
a first bonding pad to receive a first voltage;
a second bonding pad to receive a second voltage; and
basic units electrically connected between the bonding pads, each basic unit comprising:
    a pair of first LEDs, one of the first LEDs configured to emit light only when the first voltage is received and the other of the first LEDs configured to emit light only when the second voltage is received;
    a pair of second LEDs, one of the second LEDs configured to emit light only when the first voltage is received and the other of the second LEDs configured to emit light only when the second voltage is received; and
    a third LED disposed between the first LEDs and the second LEDs and configured to emit light when the first voltage is received and when the second voltage is received,
    wherein an anode terminal of the third LED is directly electrically connected to cathode terminals of the first LEDs, and a cathode terminal of the third LED is directly electrically connected to anode terminals of the second LEDs.

17. The AC LED apparatus of claim 16, wherein:
an anode terminal of the third LED is directly electrically connected to cathode terminals of the first LEDs; and
a cathode terminal of the third LED is directly electrically connected to anode terminals of the second LEDs.

18. The AC LED apparatus of claim 17, wherein adjacent ones of the basic units are rotated by 180 degrees with respect to one another.

19. The AC LED apparatus of claim 17, wherein the basic units are arranged on the substrate in different rows.

20. The AC LED apparatus of claim 19, wherein the basic units are connected in series.

21. The AC LED apparatus of claim 19, wherein the basic units are connected in parallel.

22. The AC LED apparatus of claim 19, wherein the rows of the basic units are bilaterally symmetrical to one another.

23. The AC LED apparatus of claim 17, further comprising additional third LEDs disposed between the basic units, wherein the basic units are electrically connected to each other and the additional third LEDs.

* * * * *